(12) United States Patent
Gardner et al.

(10) Patent No.: US 11,787,172 B2
(45) Date of Patent: Oct. 17, 2023

(54) COMMUNICATING PRINT COMPONENT

(71) Applicant: Hewlett-Packard Development Company, L.P., Spring, TX (US)

(72) Inventors: James Michael Gardner, Corvallis, OR (US); Scott A. Linn, Corvallis, OR (US); John Rossi, Portland, OR (US); Erik D. Ness, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/956,701

(22) PCT Filed: Feb. 6, 2019

(86) PCT No.: PCT/US2019/016817
§ 371 (c)(1),
(2) Date: Jun. 22, 2020

(87) PCT Pub. No.: WO2020/162920
PCT Pub. Date: Aug. 13, 2020

(65) Prior Publication Data
US 2021/0354450 A1     Nov. 18, 2021

(51) Int. Cl.
| | | |
|---|---|---|
| *B41J 29/38* | (2006.01) | |
| *B41J 2/045* | (2006.01) | |
| *B41J 2/14* | (2006.01) | |
| *G11C 13/00* | (2006.01) | |

(52) U.S. Cl.
CPC ......... *B41J 2/04541* (2013.01); *B41J 2/0458* (2013.01); *B41J 2/04521* (2013.01); *B41J 2/04581* (2013.01); *B41J 2/14072* (2013.01); *B41J 2/14201* (2013.01); *B41J 2002/14491* (2013.01); *G11C 13/0069* (2013.01)

(58) Field of Classification Search
CPC . B41J 2/04555; B41J 2/04586; B41J 2/04541
See application file for complete search history.

(56) References Cited

U.S. PATENT DOCUMENTS

| | | | |
|---|---|---|---|
| 5,477,245 A | 12/1995 | Fuse | |
| 5,646,672 A * | 7/1997 | Fukushima | B41J 2/365 347/211 |
| 5,745,409 A | 4/1998 | Wong et al. | |
| 5,801,980 A | 9/1998 | Wong et al. | |
| 5,917,509 A | 6/1999 | Becerra et al. | |
| 5,942,900 A | 8/1999 | DeMeerleer et al. | |
| 6,038,166 A | 3/2000 | Wong | |
| 6,116,714 A | 9/2000 | Imanaka et al. | |

(Continued)

FOREIGN PATENT DOCUMENTS

| | | |
|---|---|---|
| CL | 2021001879 A1 | 2/2022 |
| CN | 1292753 A | 4/2001 |

(Continued)

*Primary Examiner* — Lam S Nguyen
(74) *Attorney, Agent, or Firm* — Foley & Lardner LLP

(57) ABSTRACT

A communicating print component a print head comprising a number of memory bits and a single lane analog bus conductively coupling the number of memory bits to a pad located on the exterior of the print head. The pad is to transmit an electrical signal from the number of memory bits, wherein the electrical signal indicates a combination of all selected bits of the number of memory bits.

16 Claims, 16 Drawing Sheets

(56) References Cited

U.S. PATENT DOCUMENTS

| | | |
|---|---|---|
| 6,147,630 A | 11/2000 | Sasai et al. |
| 6,154,157 A | 11/2000 | Wong |
| 6,161,916 A | 12/2000 | Gibson et al. |
| 6,398,332 B1 | 6/2002 | Silverbrook et al. |
| 6,616,260 B2 | 9/2003 | Skene et al. |
| 6,866,359 B2 | 3/2005 | Pan et al. |
| 7,267,417 B2 | 9/2007 | Silverbrook et al. |
| 7,506,961 B2 | 3/2009 | Silverbrook |
| 7,510,255 B2 | 3/2009 | Tamura et al. |
| 7,613,661 B2 | 11/2009 | Nambudiri |
| 7,802,858 B2 | 9/2010 | Kasai |
| 7,874,631 B2 | 1/2011 | Sheahan et al. |
| 7,954,929 B2 | 6/2011 | Edelen et al. |
| 8,064,266 B2 | 11/2011 | Roohparvar |
| 8,474,943 B2 | 7/2013 | Ness et al. |
| 8,561,910 B2 | 10/2013 | DePaula et al. |
| 8,888,226 B1 | 11/2014 | Gardner et al. |
| 8,960,848 B2 | 2/2015 | Yokouchi |
| 8,977,782 B2 | 3/2015 | Miyasaka |
| 9,224,480 B2 | 12/2015 | Grant et al. |
| 9,472,288 B2 | 10/2016 | Gardner et al. |
| 9,493,002 B2 | 11/2016 | Edelen et al. |
| 9,592,664 B2 | 3/2017 | Ge et al. |
| 11,453,212 B2 | 9/2022 | Ng et al. |
| 11,511,539 B2 | 11/2022 | Ng et al. |
| 2002/0015066 A1 | 2/2002 | Siwinski et al. |
| 2002/0136044 A1 | 9/2002 | Werner et al. |
| 2004/0017437 A1 | 1/2004 | Yamaguchi et al. |
| 2004/0239712 A1 | 12/2004 | Liao et al. |
| 2005/0099458 A1 | 5/2005 | Edelen et al. |
| 2005/0140703 A1 | 6/2005 | Ou et al. |
| 2007/0194371 A1 | 8/2007 | Benjamin |
| 2008/0049498 A1 | 2/2008 | Werner et al. |
| 2009/0040286 A1 | 2/2009 | Tan et al. |
| 2009/0244132 A1 | 10/2009 | Bruce et al. |
| 2009/0251969 A1 | 10/2009 | Roohparvar et al. |
| 2010/0277527 A1 | 11/2010 | Silverbrook et al. |
| 2010/0302293 A1 | 12/2010 | Torgerson et al. |
| 2011/0018951 A1 | 1/2011 | Muraki et al. |
| 2012/0057408 A1 | 3/2012 | Roohparvar et al. |
| 2013/0106930 A1 | 5/2013 | Lea et al. |
| 2015/0243362 A1 | 8/2015 | Nigam et al. |
| 2016/0009079 A1 | 1/2016 | Clark et al. |
| 2016/0068927 A1 | 3/2016 | Miettinen et al. |
| 2016/0185123 A1 | 6/2016 | Anderson et al. |
| 2016/0229179 A1 | 8/2016 | Anderson et al. |
| 2016/0250849 A1 | 9/2016 | Sasaki |
| 2016/0297198 A1 | 10/2016 | Edelen et al. |
| 2017/0028724 A1 | 2/2017 | Edelen et al. |
| 2017/0069639 A1 | 3/2017 | Ge et al. |
| 2017/0120590 A1 | 5/2017 | Chen et al. |
| 2017/0355185 A1 | 12/2017 | Anderson et al. |
| 2017/0355188 A1 | 12/2017 | Anderson et al. |
| 2018/0001618 A1 | 1/2018 | Anderson et al. |
| 2018/0066073 A1 | 3/2018 | Spender et al. |
| 2018/0086122 A1 | 3/2018 | Anderson et al. |
| 2018/0154632 A1 | 6/2018 | Chen et al. |
| 2018/0215147 A1 | 8/2018 | Cumbie et al. |
| 2018/0345667 A1 | 12/2018 | Edelen et al. |
| 2019/0016127 A1 | 1/2019 | Linn et al. |
| 2019/0016817 A1 | 1/2019 | Taddei et al. |
| 2019/0126632 A1* | 5/2019 | Anderson ............ B41J 2/17566 |

FOREIGN PATENT DOCUMENTS

| | | |
|---|---|---|
| CN | 1332412 A | 1/2002 |
| CN | 1727186 A | 2/2006 |
| CN | 1749980 A | 3/2006 |
| CN | 1960875 A | 5/2007 |
| CN | 101567362 A | 10/2009 |
| CN | 101683788 A | 3/2010 |
| CN | 101868356 A | 10/2010 |
| CN | 101983378 A | 3/2011 |
| CN | 103619601 A | 3/2014 |
| CN | 105280637 A | 1/2016 |
| CN | 105636789 A | 6/2016 |
| CN | 105873765 A | 8/2016 |
| CN | 106685425 A | 5/2017 |
| CN | 107073949 A | 8/2017 |
| CN | 107111537 A | 8/2017 |
| CN | 107206815 A | 9/2017 |
| CN | 107428167 A | 12/2017 |
| CN | 108886366 A | 11/2018 |
| CN | 109922964 A | 6/2019 |
| EP | 1170132 A2 | 1/2002 |
| EP | 1054772 B1 | 7/2003 |
| EP | 1232868 B1 | 8/2006 |
| JP | 61-011845 A | 1/1986 |
| JP | 08-127162 A | 5/1996 |
| JP | 11-207948 A | 8/1999 |
| JP | 2002-014870 A | 1/2002 |
| JP | 2002-519808 A | 7/2002 |
| JP | 2002-232113 A | 8/2002 |
| JP | 2004-050637 A | 2/2004 |
| JP | 2011-517006 A | 5/2011 |
| JP | 2011-230374 A | 11/2011 |
| JP | 2014-017049 A | 1/2014 |
| JP | 2017-533126 A | 11/2017 |
| KR | 10-2017-0109550 A | 9/2017 |
| KR | 20180005525 A | 1/2018 |
| RU | 2579814 C2 | 4/2016 |
| RU | 2635080 C2 | 11/2017 |
| TW | 200631798 A | 9/2006 |
| TW | 201637880 A | 11/2016 |
| TW | 201637881 A | 11/2016 |
| TW | 201813825 A | 4/2018 |
| WO | 97/18953 A1 | 5/1997 |
| WO | WO-2009064271 A1 | 5/2009 |
| WO | 2013/048430 A1 | 4/2013 |
| WO | WO-2014133534 A1 | 9/2014 |
| WO | 2015/116129 A1 | 8/2015 |
| WO | WO-2016068927 A1 | 5/2016 |
| WO | WO-2017189009 A1 | 11/2017 |
| WO | 2018/017066 A1 | 1/2018 |
| WO | 2018/156617 A2 | 8/2018 |
| WO | WO-2018143942 A1 | 8/2018 |
| WO | WO-2018156171 A1 | 8/2018 |
| WO | 2018/190864 A1 | 10/2018 |
| WO | WO-2019009902 A1 | 1/2019 |
| WO | WO-2019009904 A1 | 1/2019 |
| WO | 2020/162971 A1 | 8/2020 |

* cited by examiner

100

800

1500

COMMUNICATING PRINT COMPONENT

CROSS-REFERENCE TO RELATED APPLICATION

Pursuant to 35 U.S.C. § 371, this application is a United States National Stage Application of PCT Patent Application Serial No. PCT/US2019/016817, filed on Feb. 6, 2019, the contents of which are incorporated by reference as if set forth in their entirety herein.

BACKGROUND

Printers and printer cartridges can use a number of technologies to convey ink to a medium. The ink may be applied to a medium using a device affected by temperature differences across the device. Print quality can be determined in part by the outcome of a print job matching the input the printer is instructed to print.

DESCRIPTION OF THE DRAWINGS

Certain examples are described in the following detailed description and in reference to the drawings, in which.

DETAILED DESCRIPTION

Figure 1:
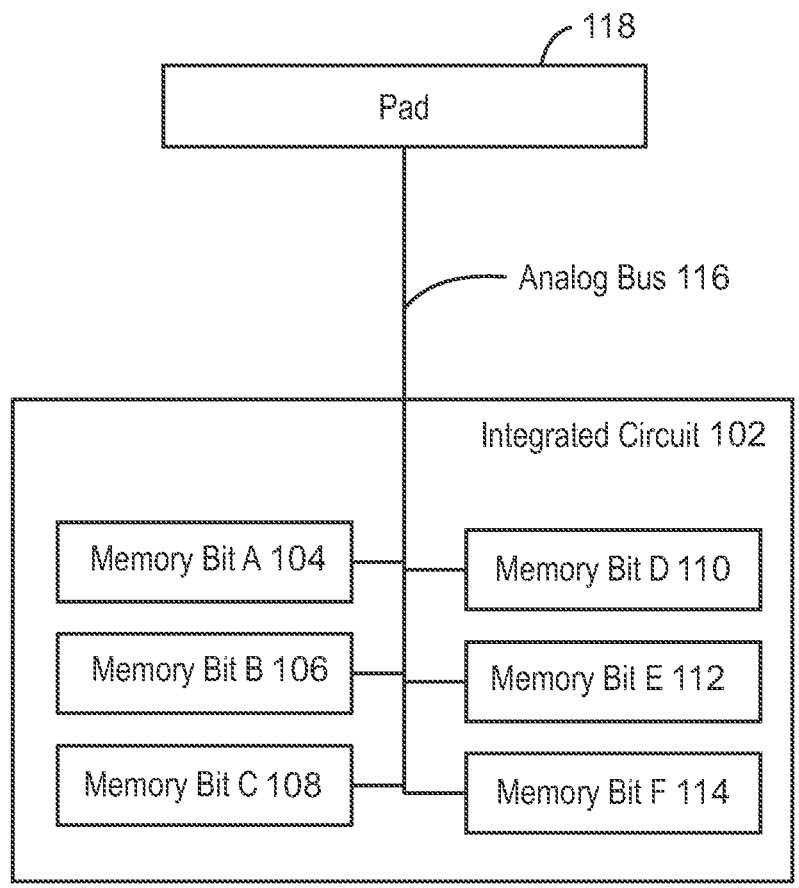
FIG. 1 is a block diagram of an example print component system.

Providing fluid, such as inks or agents, to a medium, such as pages, powder, fluid chambers etc., can include pushing fluid through nozzles with fluid actuators. In an example, the control of the fluid actuators can be regulated by memory bits located on integrated circuitry. In an example, the integrated circuitry is a print die possibly made of silicon. There may be a large number of nozzles, corresponding fluid actuators, and corresponding memory bits to manage. These memory bits may be communicatively connected in parallel by a bus. The bus many be a single lane analog bus. In the present disclosure, the bus is able to measure all combinations of memory bits in parallel. Further, use of a single lane analog bus allows the decluttering of a more complex bus wire, trace, or general print die organization. Use of a single-lane bus to measure multiple memory bits in parallel avoids the need for multi-bus die architectures. Additionally, the system disclosed provides a framework for connecting memory bits across multiple print dies with a single-lane analog bus. Reduction in the number of bus lanes needed may also reduce the number of external measurement pads because all memory bits, sections, or divisions may be measured using a single pad. In an example, the pad is external to the die to connect to a printer-side contact. In an example, the pad is an analogue signal pad to communicate an analog signal.

As used herein, specific memory bits for which measurements are being made may be selected using the single-lane bus. In an example, the single lane bus is a high speed datapath and can be a trace, wire, or other means of electronic communicative connection between components. The memory bits may be selected using information transmitted as part of primitive data in a data packet. In an example, the data packet may be referred to as a fire pulse group. In an example, the specific selections of memory bits are made using primitive data to represent a fire pulse group. The data packet, or fire pulse group, also is transmitted through the integrated circuitry in order to address or select specific fluid actuators. One method for addressing the fluid actuators includes a primitive number and an address number. In some examples, there may be a memory bit corresponding to each fluid actuator. In other examples, there may be greater or fewer memory bits than there are fluid actuators.

The memory bits may be selected using the same select lane and select logic for selecting the plurality of memory bits and fluidic actuators. In an example, the data packet carrying the information for selection of fluid actuators additionally includes data for selecting the memory bit corresponding to those specific fluid actuators, including primitive number and address number.

The use of addressing systems in this way, e.g. using a single-lane analog bus, enables multiple memory bits to be selected and read along the single-lane analog bus towards the pad. In an example, the pad is a sensor pad to communicate sensor states, in addition to the memory bits signal.

The same data line may be used to drive a number of fluid actuation devices. Furthermore, the use of a single-lane analog bus enables multiple memory bits located within the same die and on the same address to be selected and read either one at a time or in parallel combination from the same pad. In another example, using a single analog bus enables multiple memory bits within different silicon die on the same print head to be selected and read from the same select lane. Memory bits may be located on different die. Each die may correspond to a different color. For example, one pen may be a color pen and include three silicon print die. The other pen may be located in a black ink pen and may have a single silicon print die. Using a single analog bus enables multiple memory bits across multiple silicon die across multiple print heads within the print system, such as a separate color pen and black pen, to be selected and read from the same pad. In the selection of memory bits by address, each unique silicon die can select a memory bit on a different address number, but memory bits within the same die can be selected on the same address.

The integrated circuitry can be a print die. The integrated circuitry can use memory bits that are volatile or non-volatile memory (NVM) bits. In an example, the memory used in the integrated circuitry is one-time-programmable (OTP) and may be read externally using the analog pad. For example, the memory bit or bits may provide an expected or predictable analog response under various measurement conditions and combinations. Due to this more nuanced approach to accessing and making readings from multiple memory bits, access to the features of the print head are more protected from unauthorized access or manipulation. Furthermore, the increased granularity of measurement enables more specific status monitoring of the functionality of the print components. Additionally, in one example, the addressing or reading of multiple memory bits in combination, parallel, and/or simultaneously using a single lane bus can reduce the number of addressing or reading actions thereby speeding operation. Furthermore, and in contrast, using a multi-lane bus to attempt parallel reads would use multiple circuit lines that could crowd space on a print die. Additionally, adding another wire to the print head or print heads would come with an associated increase in cost and decrease in reliability.

The printing component or print component may be removable. A removable printing component may be removed or inserted from or into a printer. The same circuitry used to select which nozzles will disperse ink upon a FIRE signal can also be used to access memory of the integrated circuitry. The circuits for selecting a nozzle and selecting a memory bit can be shared. Sharing of circuitry enables, in part, the minimization of circuit area that is used. Further, inadvertent signaling between these two components that share a line can pose a risk of inadvertent actions or memory changes. The present disclosure includes methods and devices intended to safeguard from inadvertent signaling by using an access sequence before allowing access to the memory.

As noted, printer circuitry may include shared lines between fluid actuation circuitry and memory cell circuitry. In an example, and to reduce on-die complexity, much of a high speed datapath that is used to select inkjet nozzles is multi-purposed to also select memory elements. The specific techniques for memory bit selection may enable the safeguards with a memory access sequence to ensure memory bits aren't inadvertently selected while printing. Memory bits that are inadvertently selected while printing could be corrupted and unusable in the print head memory.

The present techniques show an access mode sequence used to access memory read and write modes in integrated circuitry such as a print head. In an example, the print head can include a die such as a silicon die. The silicon die may be long pieces of silicon. In order to reduce the size and therefor cost of the raw silicon, the size or profile of the circuitry can be reduced by multiple components sharing the same signaling lines. For example, the selection of nozzles can use the same hardware used for setting of memory bits. In an example, the memory bits or memory cells may be non-volatile memory (NVM). The use of NVM may be used to transfer information from the print head to the printer. The communication of information such as measurements of cracks and temperatures off of the die enables computation and adjustment of instructions to the print head according to the detected conditions. In an example, the information included in the NVM to be communicated to the printer can include thermal behavior of a die, offsets for a die, region information, a color map, the number of nozzles, nozzle function, die temperature in various regions, crack detection, and other information.

In order to ensure proper data is saved to the NVM rather than noise or unintended signaling for a shared component, an access sequence is used. The access sequence can prevent inadvertent writing to memory by circuits that also deliver and execute print selection data. The ability to share circuitry with no loss of quality enables significant circuit area savings. Sharing of components can include, for example, the sharing of a datapath to select both fluid actuators and NVM bits.

Another way to prevent inadvertent memory accesses is to reset the access sequence upon the falling edge of FIRE signal. This ensures signal or noise glitches on a MODE pad are limited to a first step of an access sequence where memory bits are not exposed. Instead, the process for accessing the memory bits may temporarily begin before quickly exiting without harm or incorrect signaling.

In an example, the sequence to enable a memory access mode can have six steps. In an example first step, a configuration register may be accessed in order to enable a memory mode. In an example second step, the loading of fire pulse group (FPG) data can include the bit or bits to be written along with a non-volatile memory enable (NVM-enable) bit being set in the FPG header. As used herein the FPG can refer to a data packet used to select a primitive for firing. As used herein, a primitive may refer to a group of fluid actuating devices such as nozzles. In an example, the NVM-enable bit may refer to an enabling bit stored in a memory element such as a floating gate avalanche metal oxide semiconductor (FAMOS) element. In an example third step, a pulse of a FIRE pad from a 0 signal to a 1 signal back down to a 0, which corresponds to a low to high to low signaling sequence along the FIRE line. The FIRE signal may not only trigger the fluid actuators to actuate, but may also affect the memory circuit's configuration and memory registers by clearing data. This clearing or resetting of data aids in preventing inadvertent memory accesses if the initial access was instead by inadvertent signaling along the same lines. An example fourth step includes another configuration register access to enable memory mode. An example fifth step includes a write to a Memory Configuration Register that is only made visible once the previous four steps have been executed. Lastly, in an example, there may be a pulse of the FIRE pad from 0 signal to a 1 signal back down to a 0. During the duration of this second FIRE signal being fired in a high signal state, the bit or bits may be read from the memory elements or written to the memory elements.

With regard to loading the fire pulse group, the memory bits are selected using the same high speed datapath as is used for selecting the fire pulse group primitive data for the fluid actuators. This means memory bits can similarly be selected by primitive number and address number with the same granularity as individual fluid actuators are. In an example, whenever the FIRE pad transitions from high (1) to low (0), the NVM-enable bit in a configuration register can be cleared. As noted above, the clearing reduces the chance of inadvertent access. When the configuration register NVM-enable bit is cleared, all bits in the Memory Configuration register are also cleared. Accordingly, the falling FIRE signal disables further access to the NVM. In order to access the NVM, the configuration register NVM-enable bit must be set, along with the NVM-enable bit in the shift data. For these initial conditions, the order of occurrence is interchangeable so long as they both occur before the FIRE signal rises. When the FIRE signal rises or goes high, this signal allows the NVM-enable bit from shift data to set a latch inside the integrated print die. In an example, once that internal latch is set, the NVM-enable bit in a configuration register can be re-written to a 1 because the NVM-enable bit was cleared by the falling FIRE signal. In this example, anytime the NVM-enable bit is 0, the memory configuration register is cleared. Using a set internal latch along with a NVM-enable bit being set in the configuration register, the memory configuration register is enabled for writing.

In an example, a memory configuration register is a shadow register in that it can run parallel to the configuration register connections but is limited to writing bits only after complex conditions are met in a certain order. As such, the memory configuration register may be enabled via a bit in the dot data stream as well as a bit in the configuration register, which then enables the memory configuration register for shifting. Further, in an example, the memory configuration register can be used as a final enable for NVM mode and also to select read/write and column or special memory bits.

While several sequences are shown, other more complex serial write protocols are contemplated in the scope of the techniques disclosed here. Other complex access techniques could be used to further ensure NVM could not accidentally be accessed during normal (non-NVM) operations. The access sequences and protocols discussed herein can also be further modified in a number of ways, such as eliminating the memory control register which is essentially a shadow, parallel register to the configuration register. Furthermore, in the examples discussed herein with regard to signaling, the MODE pad signal could also be used to replace the FIRE signal to invoke memory access of the memory configuration register.

FIG. 1 is a block diagram of an example print component system 100. The simplified diagram includes and excludes components in order to provide context to show the techniques.

A print component can be a print cartridge, a print carriage to hold multiple pens and cartridges, or print hardware for organizing other components of the printing system. In an example, the print component may be removable and replaceable in a printing system. The print component may be a refillable device. The print component may include a tank, chamber, or container for fluid such as ink. The print component may include a replaceable container for fluid.

The print component may include an integrated circuit 102. The integrated circuit 102 may be disposable. The print component and integrated circuit 102 may be physically joined so that both are disposed at the same time. In an example, the print component and the integrated circuit 102 may be physically severable such that one may be disposed and replaced while the other remains in a printing system. The integrated circuit 102 may include a number of nozzles through which fluid is dispensed. The integrated circuit 102 may include a number of fluid feed nozzles through which fluid actuators drive the fluid through in the direction of print medium. The print medium may be paper, plastic, and metal, among others. In an example, the integrated circuit 102 may operate through piezoelectric jetting, thermal jetting, or other printing technologies using multiple points of dispersion along the print head.

The integrated circuit 102 may include a number of memory bits. In an example, the integrated circuit 102 may include memory bit A 104, memory bit B 106, memory bit C 108, memory bit D 110, memory bit E 112, and memory bit F 114. Collectively, these memory bits may be referred to as a number of memory bits.

The number of memory bits may be conductively coupled by a single lane analog bus 116 to a pad 118 located on the exterior of the integrated circuit 102. In an example, the pad 118 may be located on the exterior of the print component. The conductively coupling of the number of memory bits to the pad 118 can include electronic connection through wires or traces. In an example, the coupling may be through other communicative means providing analog information to the pad 118.

A memory bit, or a specific combination of memory bits may be selected, accessed, or read all at once. A combination of selected memory bits may be individually identified and selected for simultaneous reading, access, or action. In an example, a memory bit or combination of memory bits is selected using a memory access mode and the single-lane analog bus 116. In an example, the memory bits are selected by a memory access mode enabled using a configuration register access. In an example, the configuration of a memory access mode may be done through other data structures and organization schemes other than a register. The use of the memory access mode and the single-lane analog bus to select, manipulate, activate, or read multiple memory bits in parallel is done through a serial datapath to select the desired primitive and address of each memory bit to be measured. Once the memory bits are selected through the use of primitive and address information conveyed through a serial datapath, the memory bits may be accessed or read at the same time through the shared single-lane analog bus 116 to the pad 118.

In an example, a reading of a memory bit may result in a voltage output to be measured when a known current is applied to the selected memory bit. In an example, a reading of a memory bit may result in a current output to be measured when a known voltage is applied to the selected memory bit. Similarly, these measurements for known inputs may be made for combinations of memory bits being measured simultaneously. The unique combination of memory bits selected for measurement may be predictable and assignable to specific combinations of memory bits. Accordingly, the measurement of a combination of memory bits may be done in parallel with the response depending on how many bits are selected and how many of the selected bits are programmed. In an example, a programmed memory bit may respond differently than a non-programmed memory bit. Thus, when a known analog signal is applied to a memory bit or combination of memory bits, a connected pad 118 may detect an analog output signal that can be used to make measurements conveying the specific combination of memory bits selected and whether those memory bits are programmed or not.

As the pad 118 receives the signal from the analog bus 116, the electrical signal may be transmitted further to a print component contact and eventually to evaluator circuitry. The electrical signal transmitted by the pad 118 is an electrical signal representative of the number of memory bits, and more specifically, the signal represents the combination of all selected bits of the number of memory bits.

Memory bits can be measured by either forcing a current or forcing a voltage. The output analog signal in response to a forced current or voltage is distinct both for single memory bits and combinations of memory bits. In an example, an integrated circuit 102 may include one thousand memory bits per integrated circuitry or print die. In the present disclosure, each of the number of memory bits could be connected to the analog bus 116. Through this connection, each of the one thousand bits can be individually, or a subset in parallel based on common addresses, selected and connected to the pad. In an example, the pad is on the integrated circuitry of the print head, or on-die. The memory bits may be floating gate metal-oxide semiconductor field-effect transistors (MOSFETs) and may behave with relatively high resistance when unprogrammed and relatively lower resistance when programmed. Leveraging this resistance property enables known response relationships to be established using Ohm's law relating current, voltage, and resistance.

For example, when a current is applied, a voltage may be read or measured. To apply a known current across selected memory bits, an internal or external current source may be used. In an example, the external current source may be provided through the pad along the single-lane analog bus. A known current is applied across the selected memory bit or combination of bits in parallel. As each memory is wired in parallel, in response to a known current, each additional memory bit that is programmed reduces an output voltage response. This complies with Ohms law where as the number of resistors, i.e. programmed memory bits, which are wired in parallel increases, the output voltage decreases predictably. Accordingly, based on the measured output voltage, information can be known about the combination of memory bits that is selected or programmed.

In a corresponding way, when a known voltage is applied as an input for memory bit measurements, the current may be measured. To apply a known voltage across selected memory bits, an internal or external voltage may be used. In an example, the external voltage may be provided through the pad along the single-lane analog bus. The known voltage is applied across the selected memory bit or combination of bits in parallel. As each memory is wired in parallel, in response to a known voltage, each additional memory bit that is programmed increases an output current response. This complies with Ohms law where as the number of resistors, i.e. programmed memory bits, which are wired in parallel increases, the output current increases predictably for a known and constant voltage. Accordingly, based on the measured output current, information can be known about the combination of memory bits that is selected or programmed.

Figure 2:
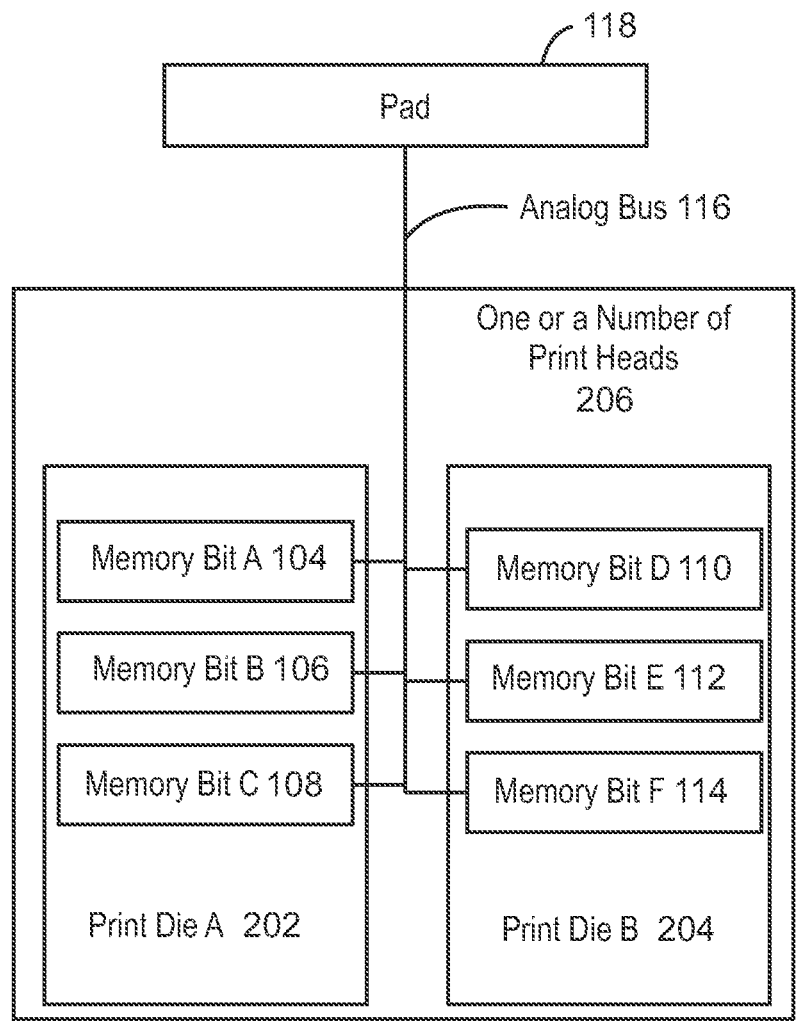
FIG. 2 is a block diagram of an example multi-die print component system.

FIG. 2 is a block diagram of an example multi-die print component system 200. Like numbered items are as discussed with respect to FIG. 1.

In the print component of FIG. 2, memory bit A 104, memory bit B 106, and memory bit C 108 may all be located in print die A 202. In an example, the print die of print die A 202 may be a form of integrated circuitry. The print die of print die A 202 may be a silicon print die. Further, in the print component of FIG. 2, memory bit D 110, memory bit E 112, and memory bit F 114 may all be located in print die B 204. In an example, the print die of print die B 204 may be a form of integrated circuitry. The print die of print die B 204 may be a silicon print die.

The organization of the print component may allow for the location of a first memory bit such as memory bit A 104 on a first die such as print die A 202, and the location of a second memory bit such as memory bit D 110 on a second die such as print die B 204. In this organization with memory bits split between print die, the analog bus 116 may still connect each of the memory bits across multiple die in a single lane pathway to the pad 118. As the analog bus 116 remains connected in parallel across multiple die, the memory bits of multiple die can be read simultaneously in parallel in the same was as if all memory bits were not separate by die as seen in FIG. 1. For example, a known voltage could be simultaneously applied to the memory bits of both print die A 202 and print die B 204. As the known voltage is applied to the memory bits across both die, the combination of memory bits can be read in parallel through the single-lane analog bus connected to the pad 118.

In an example, print die A 202 may dispense a first fluid type such as red. The print die B 204 may dispense a second fluid type such as blue. The measurement, selection, and reading from multiple memory bits may still be conducted across multiple print die each printing a differing color from the other print die. In an example, the print die A 202 and print die B 204 may be disposed on one or a number of print heads 206.

Figure 3:
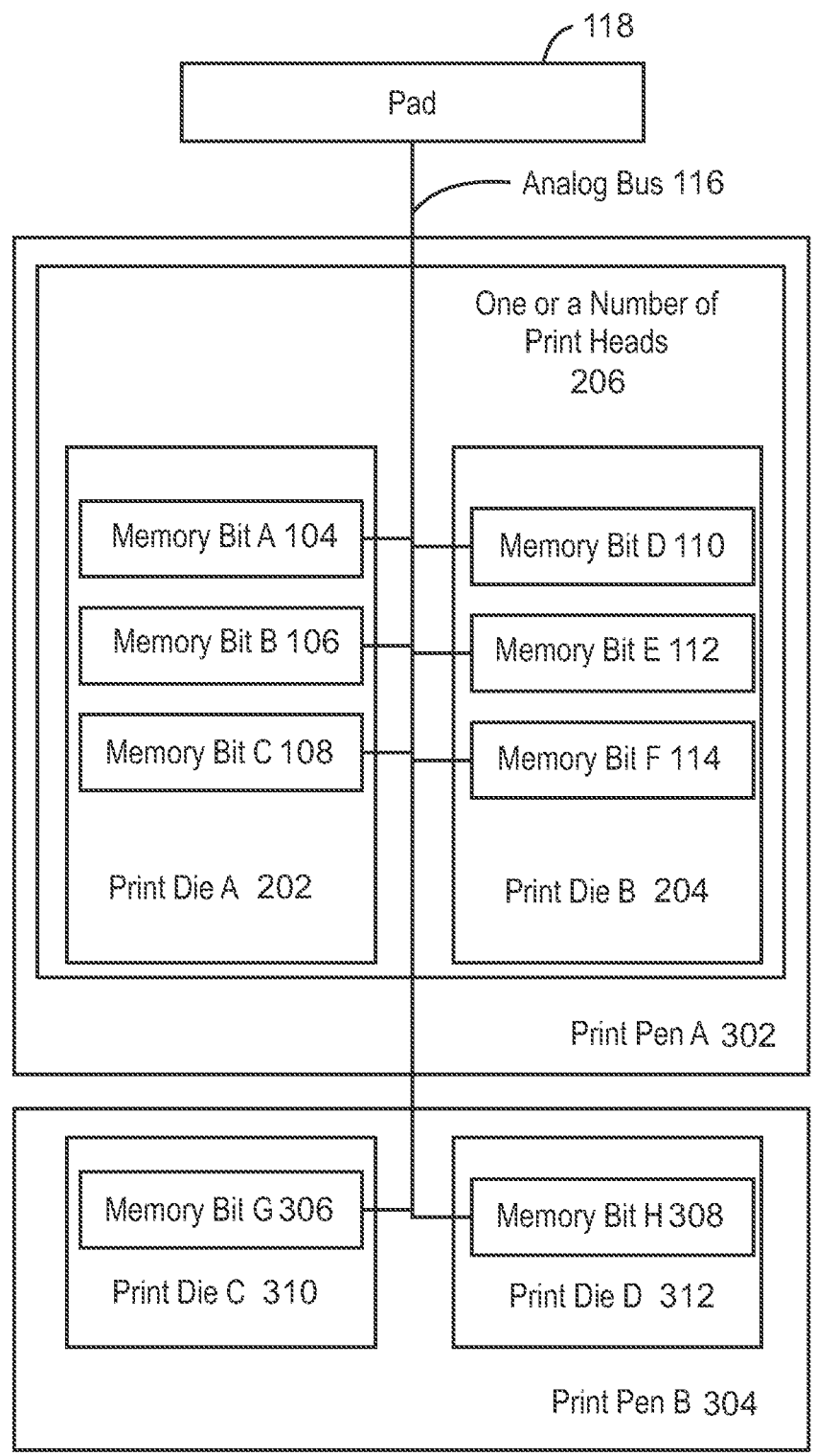
FIG. 3 is a block diagram of an example multi-pen print component system.

FIG. 3 is a block diagram of an example multi-pen print component system 300. Like numbered items are as discussed with respect to FIG. 1 and FIG. 2.

The print component of FIG. 3 includes a print pen A 302 containing the one or a number of print heads 206. The print component of FIG. 3 also includes a separate print pen B 304. As used herein, a print pen may be a carriage, holder, separator, print casing, print cartridge or other separating manufacture or device. Print pen B 304 is shown with memory bit G 306 and memory bit H 308 disposed in print die C 310 and print die D 312, respectively. The memory bits and print die of print pen B 304 are the same in function as the memory bits and print die of print pen A 302 although physically distinct from one another. Memory bit G 306 and memory bit H 308 may be connected by the analog bus 116 in parallel with the memory bit A 104, memory bit B 106, memory bit C 108, memory bit D 110, memory bit E 112, and memory bit F 114. The memory bits in both print pen A 302 and print pen B 304 are communicatively coupled through the analog bus 116 to the pad 118.

In this multi-pen print component system 300 memory bits may be split between print die and print pens, and the analog bus 116 may connect each of the memory bits across the multiple die in the multiple print pens in a single lane pathway to the pad 118. As the analog bus 116 remains connected in parallel across multiple die, the memory bits can be read simultaneously in parallel in the same was as if all memory bits were not separated by die as seen in FIG. 1. For example, a known voltage could be simultaneously applied to the memory bits of both print die A 202 in print pen A 302 and print die C 310 in print pen B 304. The combination of memory bits across die and print pen can be read in parallel through the single-lane analog bus connected to the pad 118.

Figure 4:
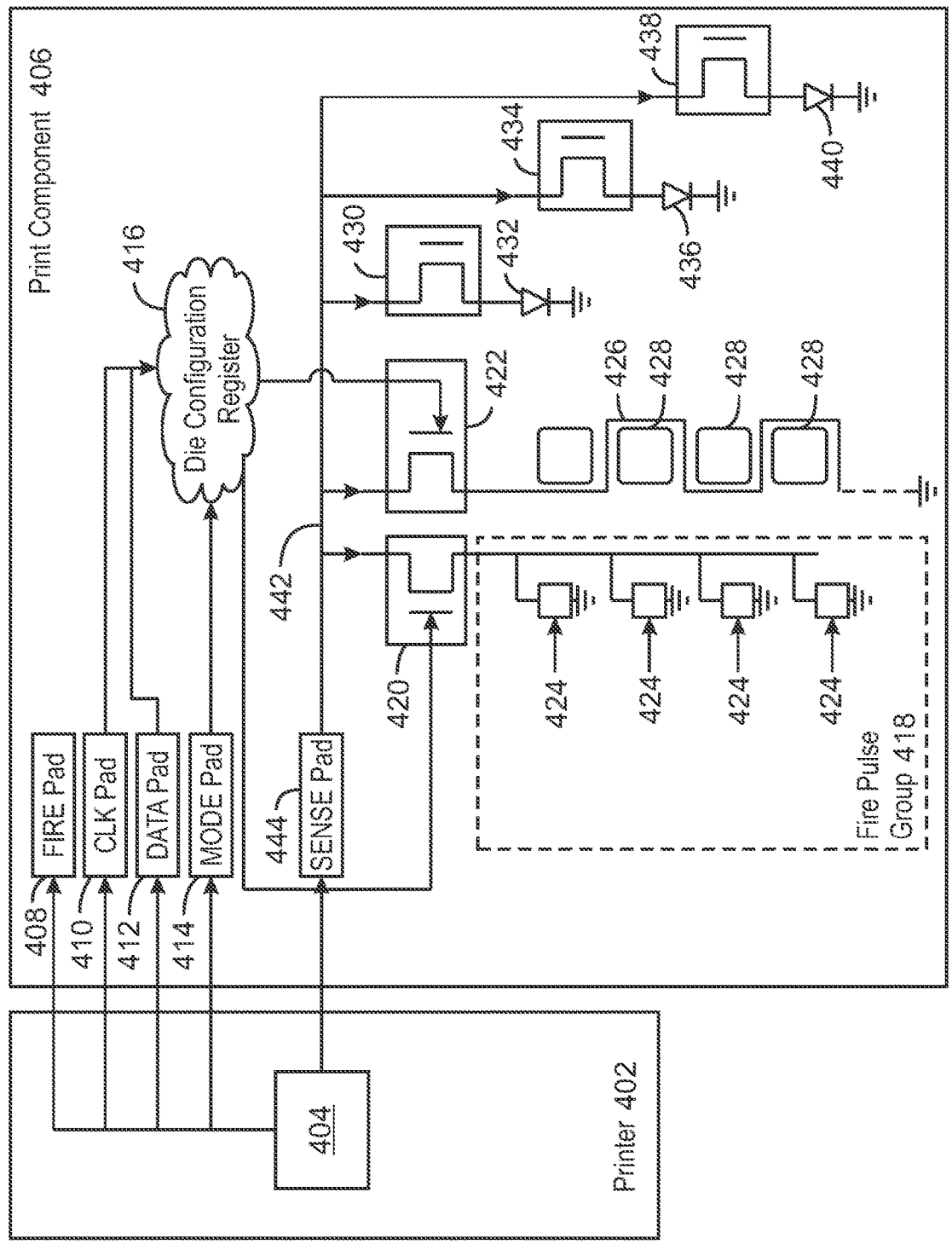
FIG. 4 is a block diagram of an example circuitry plan.

FIG. 4 is a block diagram of an example circuitry plan 400. A number of components may not be shown in order to facilitate discussion of the present techniques. Furthermore arrows shown do not limit the flow of data in a way that indicates exclusively a push or a pull of data by components, but instead indicates a general flow of information relevant to the disclosed techniques.

The circuitry plan 400 can allow for a separate printer 402 including an printer integrated circuit 404, or application specific integrated circuit (ASIC). The printer 402 may use the printer integrated circuit 404 to process or interact with the messages and data to be sent and received from a print component 406. In an example, the print component 406 can be a print cartridge that is removable or refillable. The print component 406 may be a print pen, a printer cartridge, a print head, or may contain a number of print heads. In the print component 406, there may be a FIRE pad 408, a CLK pad 410, a DATA pad 412, and a MODE pad 414. These pads may be printer contacts that convey digital, analog, or electrical signals from the printer to the print component 406. The CLK pad 410 may refer to a clock pad. In an example, the CLK pad 410, the DATA pad 412, and the MODE pad 414 provide information to the die configuration register 416 which can configure the die or print head, including selecting fluid actuators in the fire pulse group 418, enabling an external sensor switch 420 to read the memory of the fire pulse group, and enabling other resistors in the die such as a switch for a crack detection resistor 422.

The fire pulse group 418 is a grouping of fluid actuators and their associated memory bits 424 that can be selected. In response to selection, the memory bits 424 can control whether or not fluid actuators will fire in response to a FIRE signal from the FIRE pad 408. The FIRE pad 408 may use a latch diode to select and fire data in memory bit 424 in the in fire pulse group 418.

The memory bits 424 may also store information about the function of the fluid actuators such as temperature and functionality. As discussed more thoroughly below, a memory bit 424 access can include enabling access through a memory mode being enabled as well as an access being indicated in primitive data, as well as a FIRE signal from the FIRE pad 408. As used herein, a primitive may refer to the group of fluid actuators and their associated memory bits 424.

The switch for a crack detection resistor 422 may enable the crack detection resistor 426 which may interweave back and forth in-between nozzles 428. In an example, the fluid is ink and the nozzles 428 can be nozzles.

The print component 406 may include a number of other components including an N switch 430 to enable an N diode 432, an M switch 434 to enable an M diode 436, and an S switch 438 to enable an S diode 440.

Each of these components, the memory bits, the crack detection resistors, the switches and diodes, can be connected to a single lane analog SENSE bus 442 connected to a SENSE pad 444. In an example, the SENSE pad can be a pad that interfaces with the printer integrated circuit 404. In an example, the printer integrated circuit 404 can drive a current or a voltage through the SENSE pad 444 in order to determine an analog measurement of the response across the number of components and resistors. These analog signals being driven through the SENSE pad 444 or the die configuration register 416 or the FIRE pad 408 may be biased or grounded. The printer integrated circuit 404 may include its own analog bias and analog to digital conversion within the printer 402 and off of the printer component 406. In an example, the removal of the analog to digital conversion may move this operation and component off of the print die. Additionally, the printer integrated circuit 404 can force a current to measure voltage of components such as a combination of the memory bits 424. Also, the printer integrated circuit 404 can force a voltage to measure current of the combined memory bits 424 in order to monitor the on-die sensors and selected memory bits corresponding to fluid actuators.

In the present disclosure, the number of memory bits 424 can be selected by select logic used to select the plurality of memory bits and fluidic actuators using the same select lane. Further, the electrical signal coming from the printer integrated circuit 404, may be an external current force relative to the print component 406. The application of the external current force can yield a lower measured voltage on a pad, such as the SENSE pad 444 for the number of memory bits 424 relative to voltage that would be measured for a single memory bit 424 selected. This is because as the number of resistors, e.g. selected memory bits 424, increases, the output voltage for a set and known input current will decrease.

Likewise, the electrical signal coming from the printer integrated circuit 404 can be an external voltage force applied to the print component 406. The application of the external voltage force can result in a greater measured current draw as measured by the pad, such as the SENSE pad 444 for the number of memory bits 424 when compared to the current draw that would be measured for a single memory bit 424 selected. This is because as the number of resistors, e.g. selected memory bits 424, increases, the current draw for a set and known input voltage will increase.

In an example, the print component 406 includes memory bits 424 that correspond to fluid actuators proximate to nozzles 428. Additionally, the pad, such as the SENSE pad 444, can be conductively connected to transmit an electrical signal from a crack detection resistor 426 in combination with the number of memory bits 424. Furthermore, this conductive connection is over a single lane analog SENSE bus 442. In an example, the memory bits 424 correspond to fluid actuators proximate to a number of nozzles 428, and the crack detection resistor 426 is routed in-between the nozzles 428.

Figure 5:
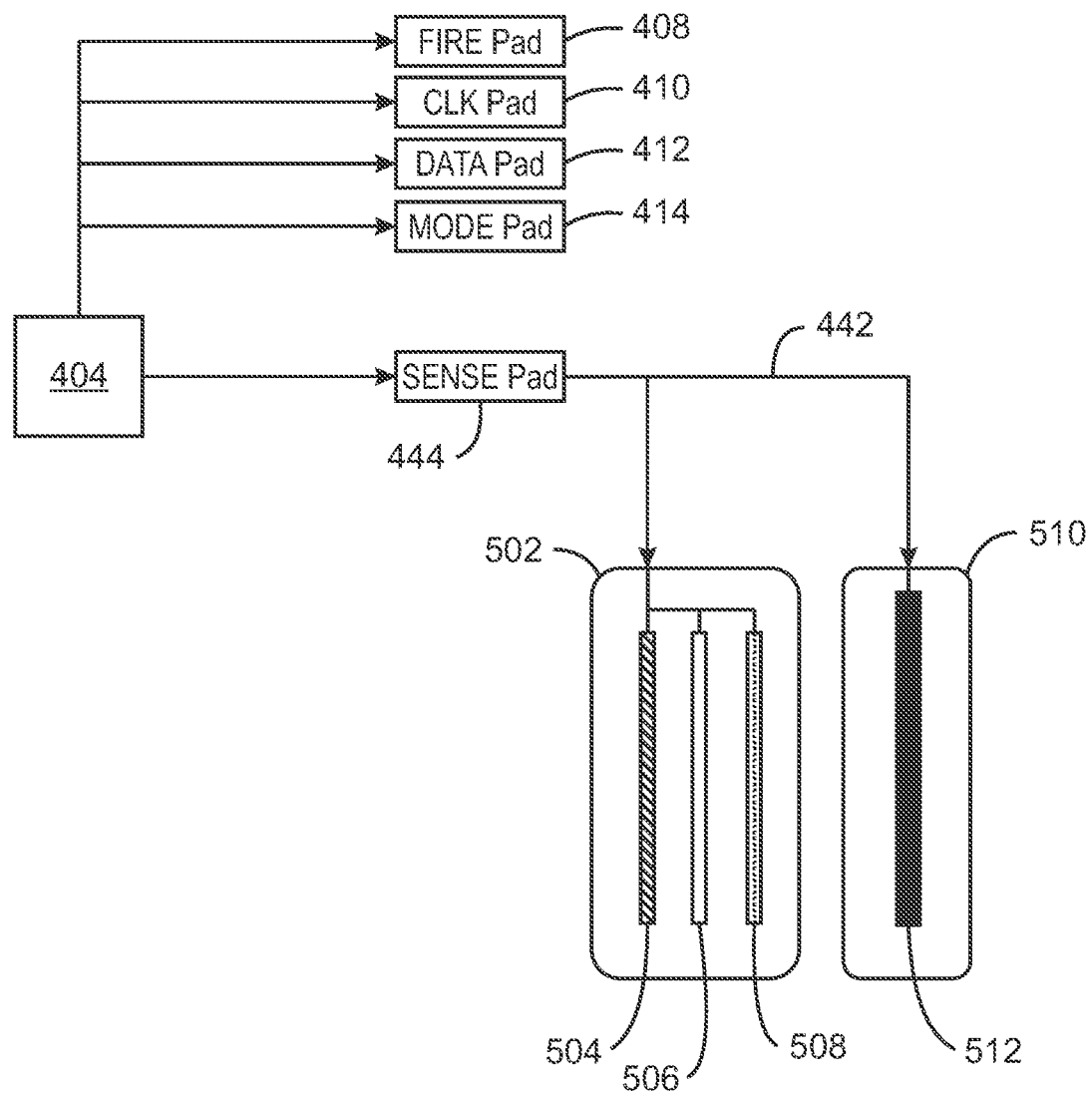
FIG. 5 is a block diagram of an example multi-pen sensor architecture.

FIG. 5 is a block diagram of an example multi-pen sensor architecture 500. Like numbered items are as disclosed with respect to FIG. 4.

The integrated circuitry such as a printer die may be separated into a number of silicon die for black ink and color ink. In an example, each die may be assigned their own color. In an example, each color may have a corresponding die separate from other die. The die can be disposed in separate print pens.

In FIG. 5, there may be a color print pen 502 to hold a cyan print die 504, a magenta print die 506, and a yellow print die 508. Other color print dies are compatible including RBY (red, blue, yellow) combinations of print die. As seen in the color print pen, 502 each of the print die is a physically separate print die, however the single lane analog SENSE bus 442 remains common across all of the color die in the color print pen 502.

In the multi-pen sensor architecture 500, there may be a monochromatic print pen, such as a black print pen 510 carrying a black print die 512. The single lane analog SENSE bus 442 connects to the black print die 512 as well as the color print die in the separate print pen in series. Accordingly, a signal forced through the SENSE pad 444 could be gather a measurements from print die located in multiple physically separate print pens including the color print pen 502 and the monochromatic print pen 510. In an example, print pen 502 and 510 may be removable.

In an example, the single sense contact pad, such as the SENSE pad 444, may be used to communicate stored data from a single lane analog bus 442 conductively coupled to communicate a number of memory bits in combination in a single analog signal over the single sense contact pad, such as the SENSE pad 444. In an example, a first memory bit of the number of memory bits can be located on a first silicon die, such as the cyan print die 504 and a second memory bit of the number of memory bits can be located on a second silicon die, such as the magenta print die 506.

In an example, the memory circuit can include a first silicon die that is associated with a first fluid type, such as the cyan print die 504, and the second silicon die is associated with a second fluid type, such as the magenta print die 506. The memory circuit can also include a first silicon die that is located in a first print pen, such as the color print pen 502, and the second silicon die is located in a second print pen, such as the monochromatic print pen 510. In an example, the data pad 412 may be separate for each print die while the MODE pad connection, the CLK pad connections, and the FIRE pad connections are shared by the print die.

Figure 6:
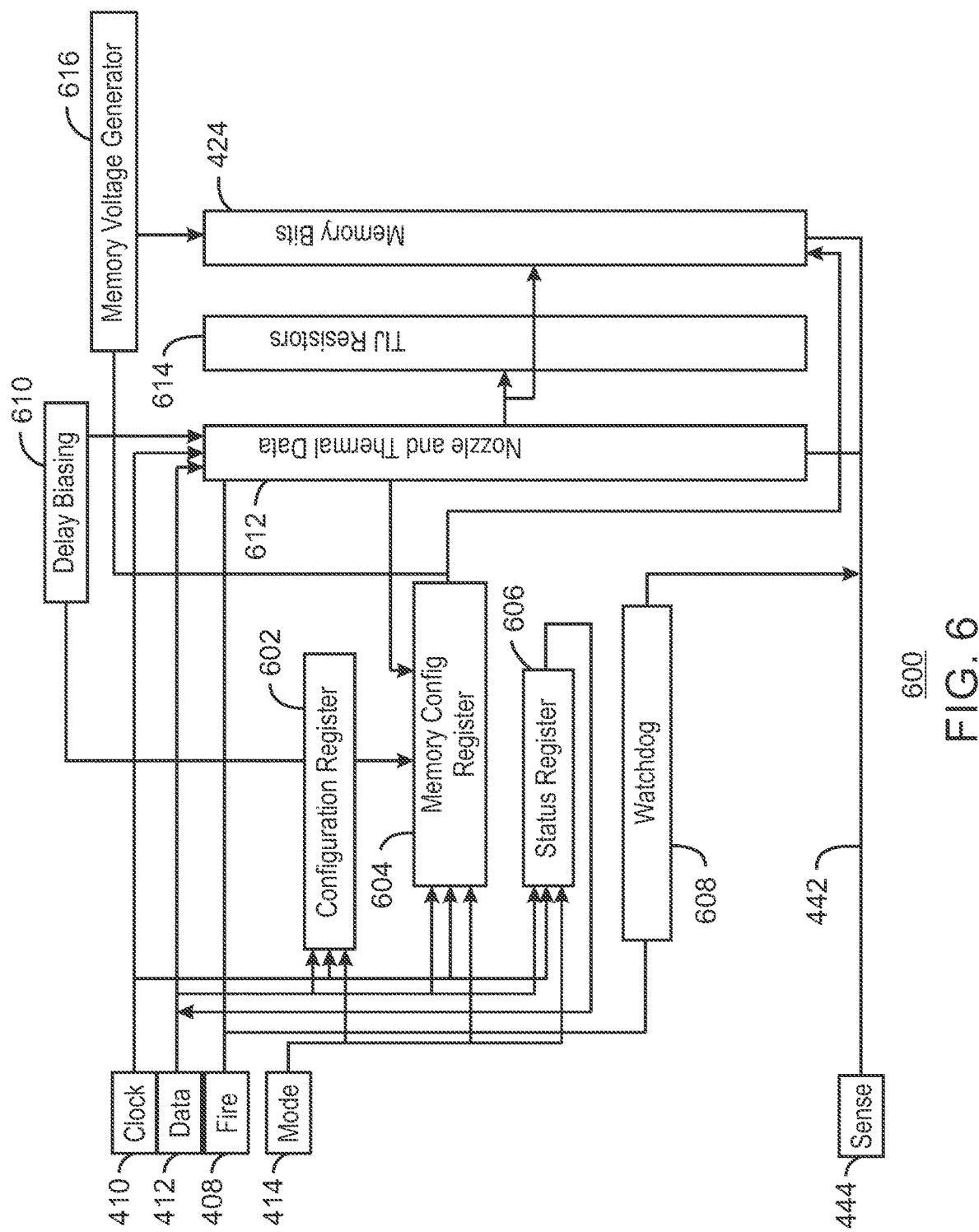
FIG. 6 is a block diagram of an example printing circuitry architecture.

FIG. 6 is a block diagram of an example printing circuitry architecture 600. Like numbered items are as described with respect to FIG. 4.

The printing circuitry architecture 600 can include a configuration register 602, a memory configuration register 604, a status register 606, and a watchdog 608. While the term register is used, other storage elements are also contemplated. The configuration register 602 may be set by a number of pads including the data pad 412, the mode pad 414, and the CLK pad 410. The configuration register may be used to set Control signals for testing, crack detection, enabling the watchdog 608, analog delays including delay biasing 610, Memory access through memory bits 424, and validation through confirmation of sensing through the SENSE pad 444. Other configurations of the configuration register 602 can include a test selection, a sense pad 444 test, the voltage delay for circuitry for specific nozzles. One reason for these delays could include to avoid fluid interference from too many drops ejecting from nearby nozzles at the same time. The configuration register 602 can also include and set bits for memory bit 424 accesses via a memory bit enable. The configuration register 602 can include crack detection enabling and the watch dog enabling.

In an example, the memory configuration register 604 at least three bits, one indicating a column enable so that all memory column bits in the indicated column can be accessed. The memory configuration register 604 also includes a memory write enable to indicate a read or write mode. The memory configuration register 604 also includes a region enable to enable access to regionalized memory bits 424.

The status register 606 can include a status as indicated by DATA pad 412, the CLK pad 410, and the MODE pad. The status register 606 may report print head status information . . . . In an example, one bit of the status register 606 may be a watchdog bit to monitor an input pad and indicate when a status, such as a FIRE signal may not be functioning properly. In an example, the status register may also include revision bits to indicate other information. In an example, the status register may be used during a wafer test for prober alignment.

The watchdog 608 ensures that if the FIRE signal from the FIRE pad 408 is drive at a high level past a certain time threshold, then internal FIRE signals are disabled until the fault is cleared. The mechanism for clearing the fault is by turning the watchdog 608 off or through an external die reset. For example, setting the configuration register to zero also clears the watchdog fault detected bit in the status register.

The printing circuitry architecture 600 does include other pads including VDD, LGND, Nreset, PGND, and VPP, among others. The VDD may refer to a common logic power line (VDD), LGND may refer to a common logic ground line. Nreset may refer to the resetting of a watchdog 608 that has been tripped. The PGND pad may include a ground connected to the fluid actuators. The VPP pad may refer to a shared power (VPP) bus connected to the fluid actuators.

As noted above, the delay biasing 610 may adjust the firing times stored in the nozzle and thermal data 612. The nozzle and thermal data 612 may be set primarily based on the clock, data, and fire lines. The thermal data can refer to the temperature of the print head die across the nozzle array. Temperature differences can lead to banding and so temperature of different parts of the nozzle array can improve print quality through maintenance of print die temperature consistency.

The nozzle and thermal data 612 may be stored in a circuit storage element like a flip-flop and latch and may be executed through fluid actuators such as thermal ink jet resistors 614. In an example, the nozzle and thermal data also provides access to memory bits when a specific sequence is followed. The specific access sequence for of memory bits 424 using the same nozzle and thermal data is further described below with regard to FIG. 9-13. When a memory bit is accessed, the memory bit 424 may be written with a memory voltage generator 616 controlled by the memory configuration register 604.

Figure 7:
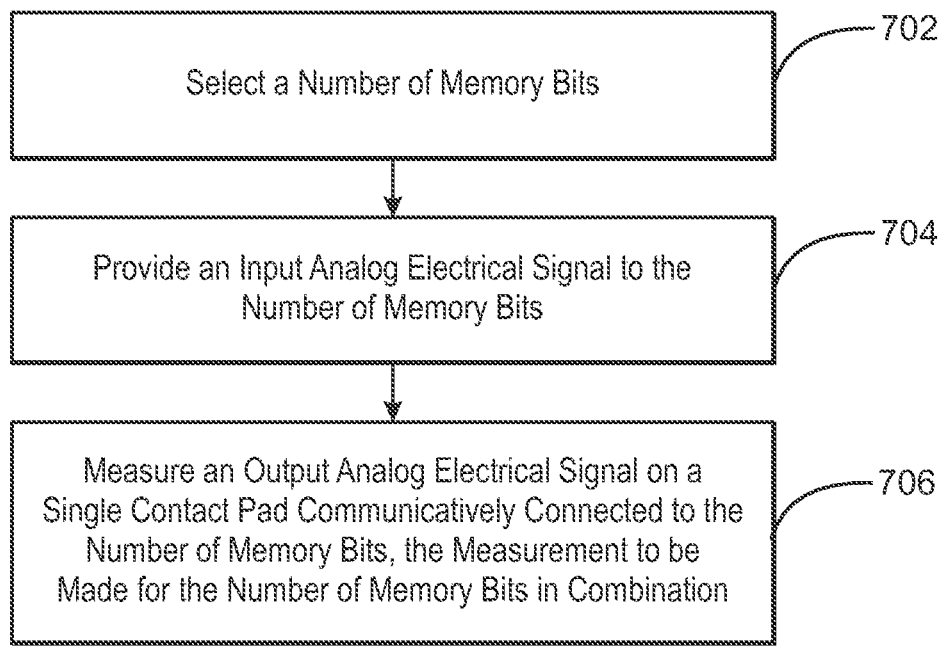
FIG. 7 is a flowchart of an example method for communicating stored data from a communicating replaceable print head cartridge.

FIG. 7 is a flowchart of an example method 700 for communicating stored data from a communicating replaceable print head cartridge. At block 702, the method 700 includes selecting a number of memory bits. In an example, the number of memory bits each correspond to a fluid actuator located on a silicon die. The number of memory bits may correspond to a number of fluid actuators, where the number of fluid actuators are located on a number of silicon dies. At block 704, the method 700 includes providing an input analog electrical signal to the number of memory bits.

At block 706, the method 700 includes measuring an output analog electrical signal on a single sense contact pad communicatively connected to the number of memory bits, the measurement to be made for the number of memory bits in combination. In an example, the output analog electrical signal is measured to be a lower voltage on the single sense contact pad measuring the number of memory bits in combination relative to a comparison voltage for a single memory bit on the single sense contact pad. The output analog electrical signal may be measured to be a higher current on the single sense contact pad measuring the number of memory bits in combination relative to a comparison current for a single memory bit on the single sense contact pad.

It is to be understood that the block diagram of FIG. 7 is not intended to indicate that the method 700 is to include all of the actions shown in FIG. 7. Rather, the method 700 can include fewer or additional components not illustrated in FIG. 7.

Figure 8:
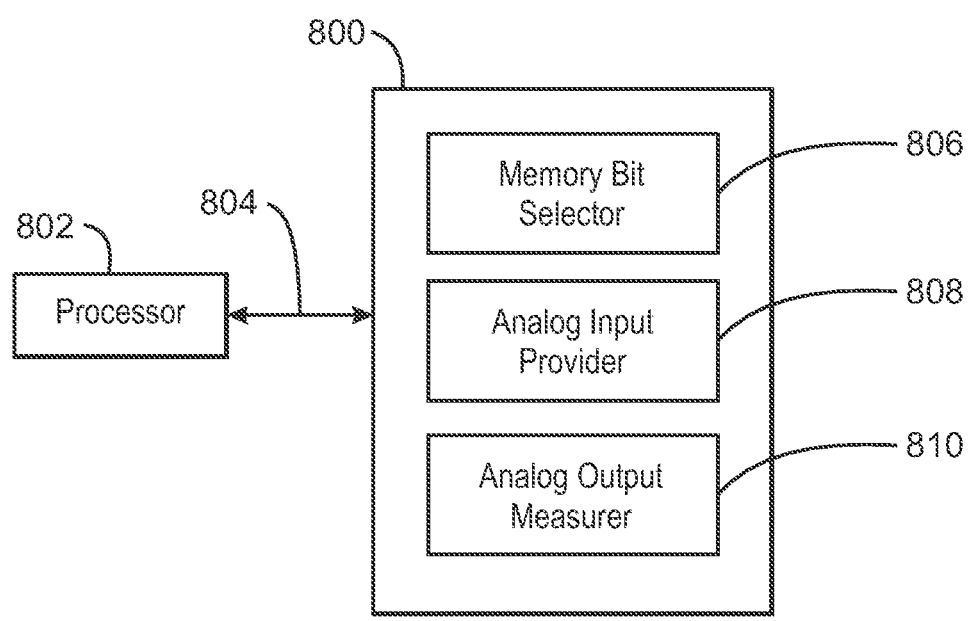
FIG. 8 is a block diagram of an example non-transitory, computer-readable medium including instructions to direct a processor for communicating stored data from a communicating replaceable print head cartridge.

FIG. 8 is a block diagram of an example non-transitory, computer-readable medium 800 including instructions to direct a processor for communicating stored data from a communicating replaceable print head cartridge. The computer readable medium 800 can include the processor 802 to execute instructions received from the computer-readable medium 800. Instructions can be stored in the computer-readable medium 800. These instructions can direct the processor 802 for communicating stored data from a communicating replaceable print head cartridge. Instructions can be communicated over a bus 804 as electrical signals, light signals, or any other suitable means of communication for transmission of data in a similar computing environment.

The computer-readable medium 800 may use a memory bit selector 806 to select a number of memory bits. In an example, the number of memory bits each correspond to a fluid actuator located on a silicon die. The number of memory bits may correspond to a number of fluid actuators, where the number of fluid actuators are located on a number of silicon dies.

The computer-readable medium 800 may use an analog input provider 808 to provide an input analog electrical signal to the number of memory bits. The computer-readable medium 800 an analog output measurer 810 to measure an output analog electrical signal on a single sense contact pad communicatively connected to the number of memory bits, the measurement to be made for the number of memory bits in combination. In an example, the output analog electrical signal is measured to be a lower voltage on the single sense contact pad measuring the number of memory bits in combination relative to a comparison voltage for a single memory bit on the single sense contact pad. The output analog electrical signal may be measured to be a higher current on the single sense contact pad measuring the number of memory bits in combination relative to a comparison current for a single memory bit on the single sense contact pad.

It is to be understood that the block diagram of FIG. 8 is not intended to indicate that the computer-readable medium 800 is to include all of the components shown in FIG. 8. Rather, the computer-readable medium 800 can include fewer or additional components not illustrated in FIG. 8.

Figure 9:
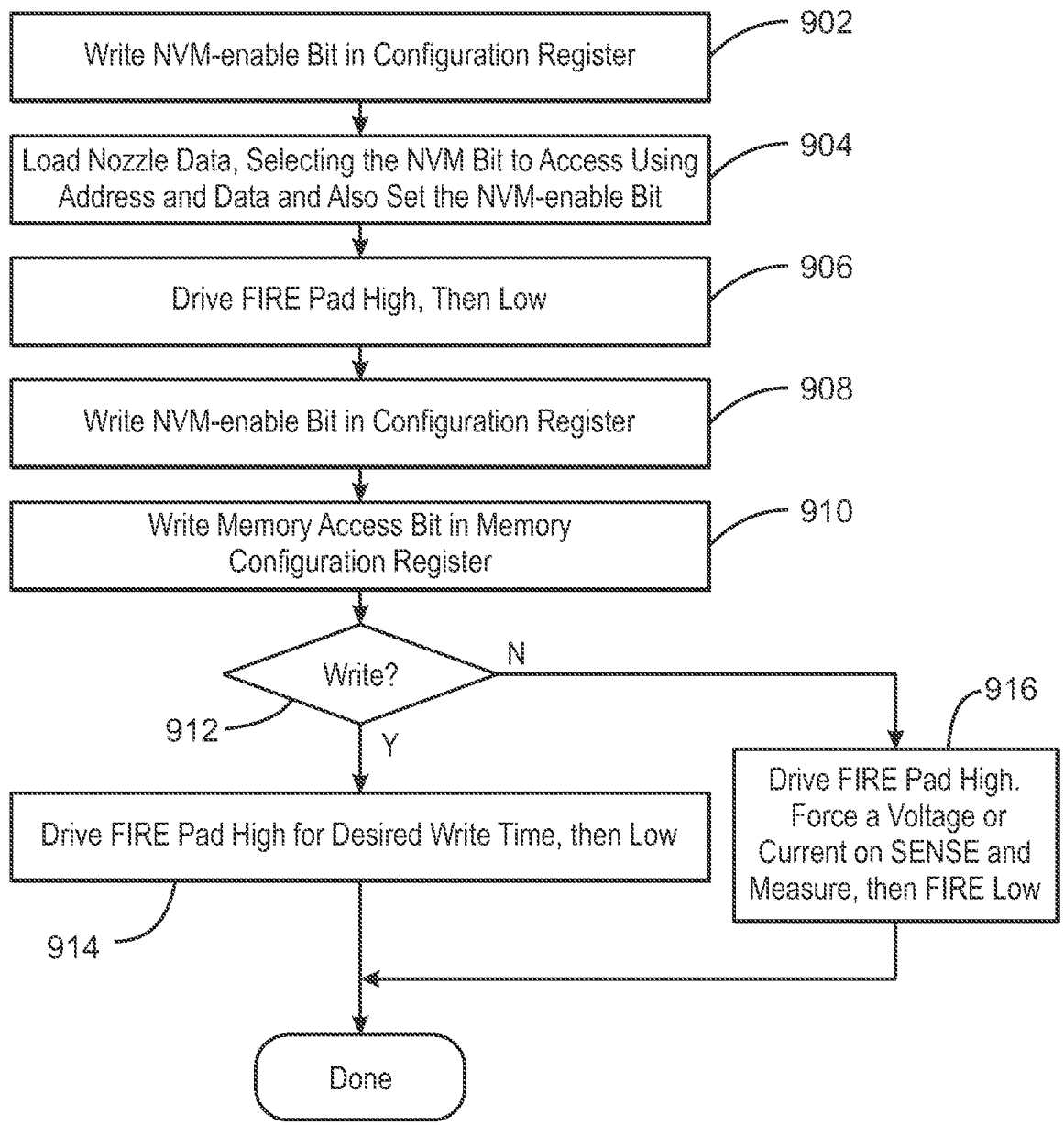
FIG. 9 is a flowchart of an example method for accessing a memory cell.

FIG. 9 is a flowchart of an example method 900 for accessing a memory cell. The order of some steps including block 902 and 904 may be performed in any order, while other steps such as blocks 906-916 are performed in the indicated sequence. Furthermore, while specific bits, signals, and circuit components such as registers are named, these specific elements are merely one example of more general components and elements that may also have the same results.

At block 902, the method 900 for accessing memory includes writing a NVM-enable bit in a configuration register. As used herein, the NVM-enable bit may refer to a bit to enable a floating gate avalanche metal oxide semiconductor (FAMOS) element that may act as a memory element. As noted above, other memory elements capable of storing and switching between at least two states of a bit of information may also be used. The writing of the NVM-enable bit to a configuration register may also refer to other examples of other storage elements other than registers. The configuration register may be replaced by other circuitry or data organization methods capable of receiving and storing information such as the NVM-enable bit for a configuration circuit within print head die.

At block 904, the method 900 includes loading nozzle data with data lines, where the nozzle data includes information for setting the NVM-enable bit in the data stream as well as the information for selecting a nonvolatile memory (NVM) bit to access using a specific address for a nozzle. As used herein, there may be a number of lines providing electrical signal into a print die, one of which can be a data line. The data line may provide information to a series of fluid actuation devices such as a selection of which nozzles are to be fired in response to an upcoming FIRE signal. The selection of which nozzles are to be fired next can be stored in NVM bits corresponding to the nozzles. In an example, the selection data provided by the data line also includes a corresponding NVM-enable bit in the nozzle selection data. In an example, the NVM-enable bit may be transmitted in the header or footer of nozzle selection data. As noted above, 902 and 904 may be done in either order. The result of these two steps is that the NVM-enable bit is written into the configuration register and the NVM-enable bit is set in the data line.

At block 906, a FIRE signal is driven from the FIRE pad of an integrated circuitry, first driven to signal high then low. As used herein, a FIRE signal is a signal that is sent to each nozzle through electrical connection to the FIRE pad. These nozzles may be grouped together in groups called primitives. In addition to the nozzles, the bits of the registers are also connected to a FIRE line which when fired results in actions being taken at the configuration register. As noted above, the use of the term register is one specific implementation and other storage elements are contemplated herein. As used herein, a signal being driven high then low refers to an amplitude of the signal roughly corresponding to the intensity of the signal whether it is a current or voltage. In an example, driving a FIRE signal high can be interpreted as a value of 1, while a FIRE signal driving low or not at all can be interpreted as having a value of 0. In an example, the FIRE signal drives from 0 to 1 to 0. The variation in the signaling can indicate when action, such as firing nozzles should take place. The driving of the FIRE pad from high to low has cleared the NVM-enable bit of the configuration register, however an internal latch has been set within the integrated circuitry. This internal latch combined with future signaling may enable a memory bit access.

In block 908, the method 900 includes writing a NVM-enable bit in a configuration register. This is the same step as block 902 however in this case, the step is performed after the internal latch has been set and the NVM-enable bit was cleared in the configuration register. Writing the NVM-enable bit again into the configuration register, while the NVM-enable bit is being transmitted through a data line enables access to a memory access bit.

In block 910, the method 900 includes writing a memory access bit in a memory configuration register. As used herein, the memory configuration register can be another storage element separate from the configuration register. In some examples there are fewer bits in the memory configuration register than the configuration register. Once a memory access bit is written into the memory configuration register, the memory of the integrated circuitry may be accessed. The enabled bits of the memory configuration register can act as control signals that enable the NVM or FAMOS memory elements to be accessed.

At decision block 912, a determination is made based on the control signals indicated by the bits of the memory configuration register. If the bits of the memory configuration register indicate a memory write, the method 900 proceeds to block 914. If the bits of the memory configuration register do not indicate a memory write, the method 900 proceeds to block 916.

At block 914, the FIRE pad is driven high for a desired write time, then low. In an example, the driving of the FIRE pad can include providing a 0 signal, then a 1 signal, then a 0 signal on the fire line. The value of the signal can correspond to a current or voltage on a FIRE line. During the duration of the write time, the memory element, such as a FAMOS, may be accessed. Accessing the FAMOS or other memory element can include writing information into the FAMOS or memory element.

At block 916, the FIRE pad may be driven high and a voltage or current forced on a SENSE line for measurement, then returning the FIRE line to a low signal. As used herein the SENSE line may refer to a sensor line connected to a pad, such as a sensor pad. The sense line may be used to detect conditions in the integrated circuitry such as cracks or temperature of a print die. Whether proceeding through block 914 or block 916, the falling edge of the FIRE signal clears the memory configuration register and clears the NVM-enable bit of the configuration register.

Figure 10:
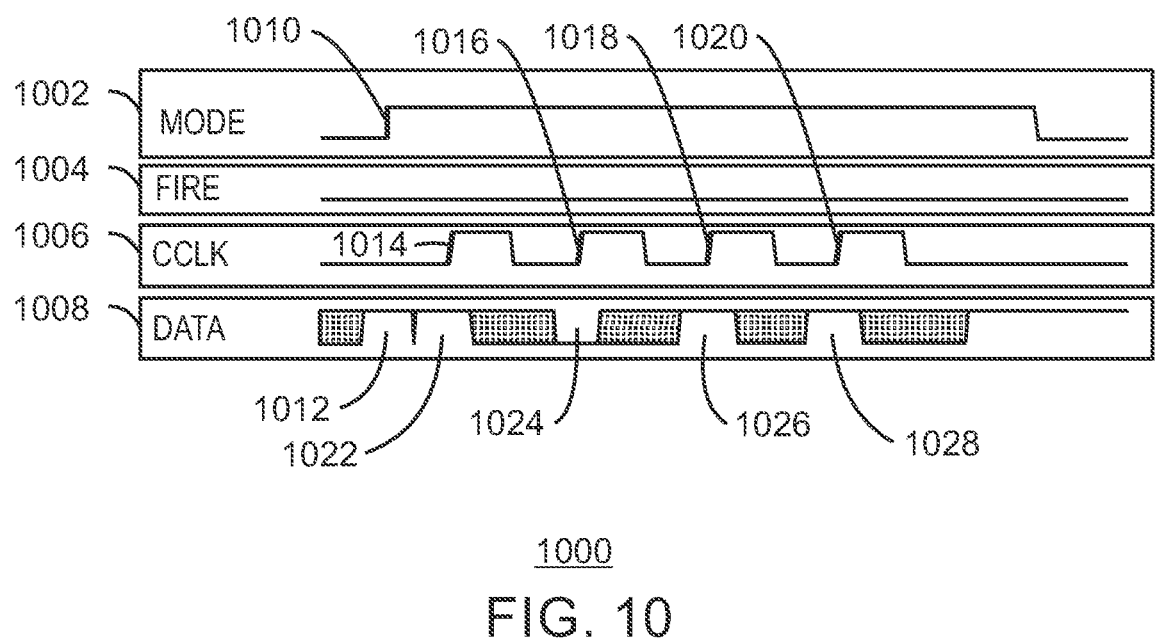
FIG. 10 is a drawing showing an example signal set for a configuration register write.

FIG. 10 is a drawing showing an example signal set 1000 for a configuration register write. As noted above, other data organizing and storing structures other than registers are contemplated. In an example, other storage elements may be used in place of a register. The signal sets are provided to illustrate one way of accessing the configuration register using the same lines that are used to provide data to fluid actuation devices such as nozzles.

The signal set 1000 can include a MODE line 1002, a FIRE line 1004, a CLK 1006 line, and a DATA 1008 line. As used herein, the mode line may be connected. As used herein, a line may refer to a signal transmission medium such as metal traces for electrical signals. For electrical signals other types of conductive lines are possible as well. Likewise if signals other than electrical signals are sent, the appropriate transmission mediums could also be used. The MODE line 1002 may indicate a mode may connect to the integrated circuitry such as a die that includes a die configuration register. The FIRE line 1004 may be connected to the configuration register of the integrated circuitry as well as fluid actuation devices and may instruct when the fluid actuation devices are to take action. This action can include dispersing ink droplets corresponding to selected fluid actuators towards a print medium. The action taken in response to a FIRE signal that is connected to the configuration register can also include the writing or clearing of bits in registers or memory.

The CLK line 1006 shows a configuration clock signal that enables actions on the rising actions of each clock tick. The DATA line 1008 can be a configuration data line for a specific print die and its associated registers and memory bits. The configuration data may be received directly from the DATA line 1008 when certain conditions are met.

For example, the configuration register may be enabled for a write action when a signal on the MODE line 1002 transitions high 1010 with the DATA line 1008 also providing a high signal 1012 that shows a signal value of 1. After a configuration register enabling action by the two lines, further data may be shifted into the enabled serial register in time with the rising edges of the CLK signal as seen in rising action A 1014, rising action B 1016, rising action C 1018, and rising action D 1020. In time with each of these rising actions, data from the DATA line 1008 may be transmitted to the configuration register. For example, data for a third place bit 1022 for a configuration register may be shifted into the register when the DATA line 1008 is signaling high at the time of rising action A 1014 on the CLK line 1006. Likewise, data for a second place bit 1024 for a configuration register may be shifted into the register when the DATA line 1008 is signaling low at the time of rising action B 1016 on the CLK line 1006. In an example, data for a first place bit 1026 for a configuration register may be shifted into the configuration register when the DATA line 1008 is signaling high at the time of rising action C 1018 on the CLK line 1006. In an example, data for a zero place bit 1028 for a configuration register may be shifted into the register when the DATA line 1008 is signaling high at the time of rising action D 1020 on the CLK line 1006. This example shows a 4-bit long configuration register write, thus the four places of data that may be indicated on the DATA line 1008 with the corresponding rising actions on the CLK line 1006. As noted above, other lengths of configuration register writes could be larger or smaller in size depending on the size of the configuration register. Likewise, similar signaling can be used to write to other memory configurations and can also vary in length and amount of data transferred in accordance with the size and structure of the memory. In an example, the rising edges of CLK shifts data into the serial configuration register, and old/extra bits are shifted off the end, such as Msbits.

Figure 11:
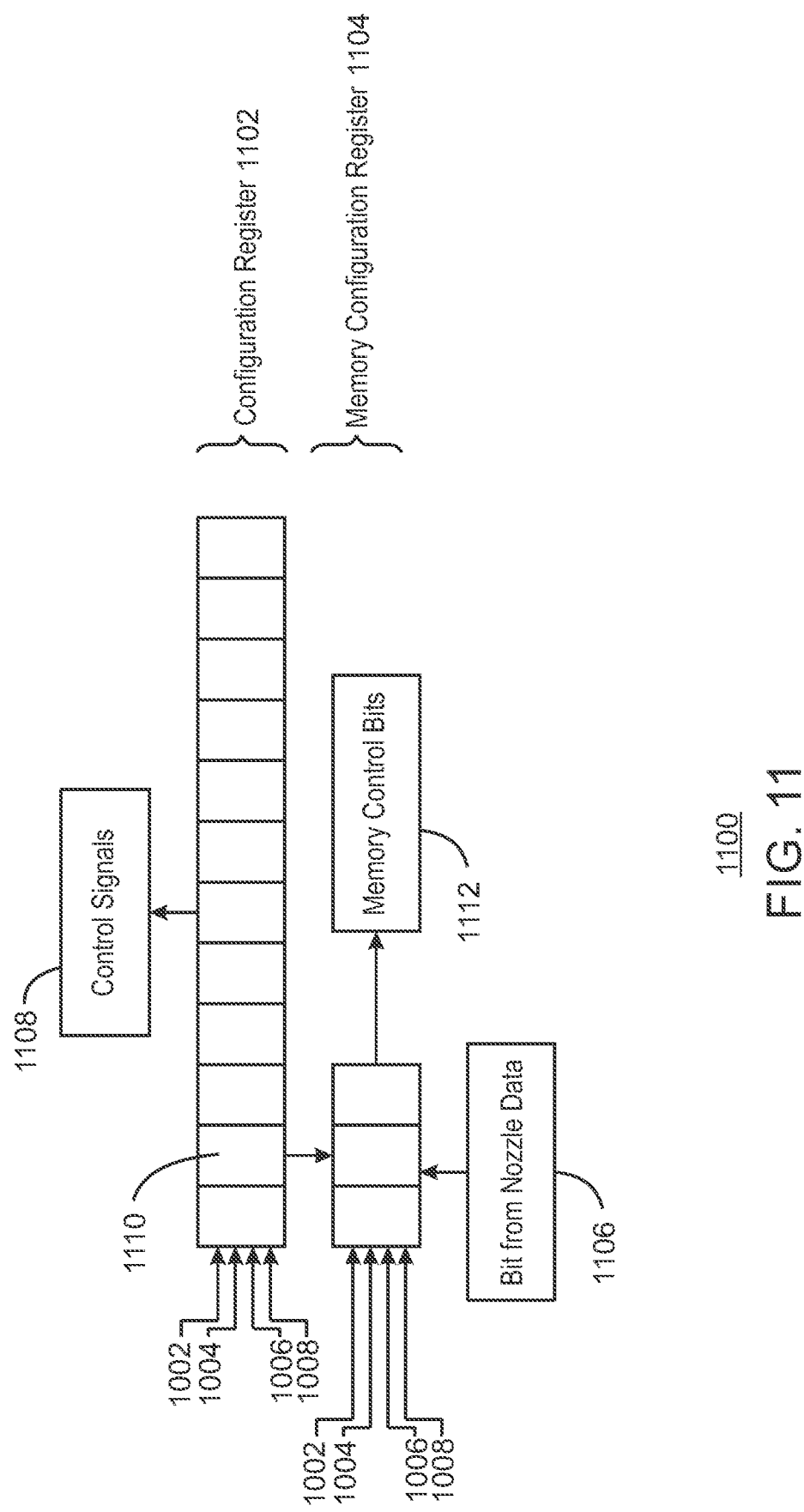
FIG. 11 is a schematic of an example access of memory bits using multiple enabled registers and nozzle data.

FIG. 11 is a schematic of an example access 1110 of memory bits using multiple enabled registers and nozzle data. Like numbered items are as described in FIG. 10. In addition, to connecting to the configuration register 1102 as noted in FIG. 11, the MODE line 1002, FIRE line 1004, CLK line 1006, and DATA line 1008 may also be communicatively connected to the memory configuration register 1104. As memory access data bits, such as NVM-enable bits can be included in nozzle data, this bit from nozzle data 1106 may write to the memory configuration register 1104 using the methods outlined at least in FIG. 9 or FIG. 13. In addition to enabling a memory access or a memory access write mode, the configuration register 1102 may also have bits to serve as control signals 1108 for testing elements of the integrated circuitry such as crack detection, watchdog enablement, analog delays, and component validation.

The memory configuration register 1104 is enabled via a bit in the dot data stream, such as the bit from nozzle data 1106 as well as a configuration register memory bit 1110 in the configuration register 1102. When all three are enabled, i.e. bit in the nozzle data 1106, configuration register memory bit 1110, and the memory configuration register 1104, then the memory configuration register 1104 is enabled to access the memory control bits 1112. When the FIRE line 1004 signals a falling edge, the bits in the memory configuration register 1104 as well as the configuration register memory bit 1110 in the configuration register 1102 are cleared.

Figure 12:
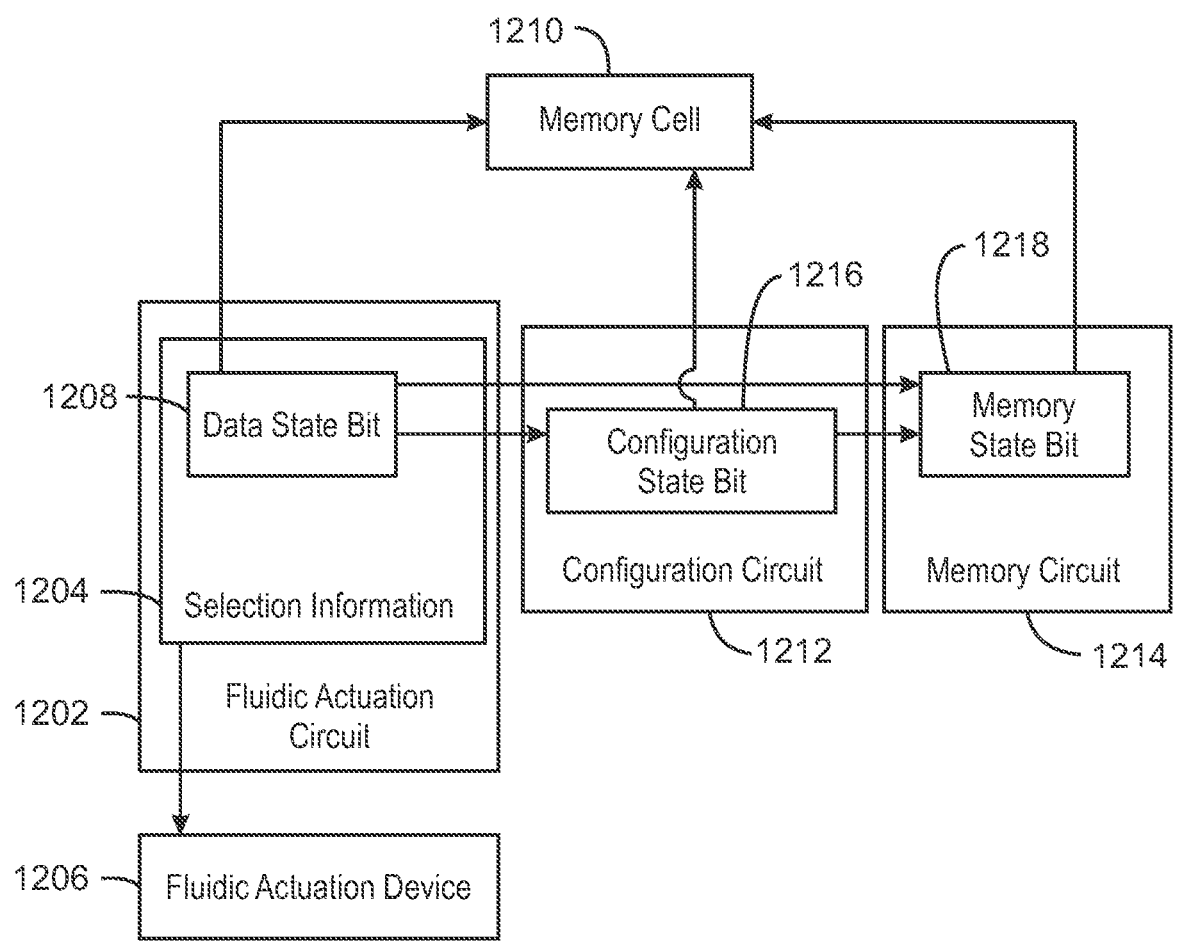
FIG. 12 is a schematic showing an example of logical circuits accessing a memory cell.

FIG. 12 is a schematic showing an example of logical circuits 1200 accessing a memory cell. Many components may not be shown to facilitate description of the shown components. Additionally, the logical circuitry shown here may be a part of the same die circuitry, may be physically separate, and may also be the same circuitry performing different tasks while in different states. For example, the fluid actuation circuit may be physically separate from the configuration circuit in one example, and in another example, they may be the same circuitry in differing states.

The logical circuits 1200 can include a fluid actuation circuit 1202. As used herein, the fluid actuation circuit 1202 may be a circuit that uses selection information 1204 to control the dispersion of fluid through a fluid actuation device 1206. In an example, the fluid actuation circuit 1202 may be disposed on or within integrated circuitry. The fluid actuation device 1206 may be a primitive of group of primitives. As used herein, a primitive may refer to a grouping of fluid dispersion nozzles that eject or otherwise displace fluid such as ink towards a print medium. The selection data 1204 in the fluid actuation circuit 1202 may be used to select specific nozzles by address line and primitive number or region number in order to indicate which nozzles may be fired in response to a FIRE signal.

The selection information 1204 may also include a data state bit 1208. The data state bit 1208 may be stored in a header or footer of a packet of selection information 1204. The data state bit may also correspond to either a 0 or a 1. In an example, a 0 of the data state bit may indicate that the data state bit is not attempting to initiate the process to access a memory cell 1210. A 1 stored in the data state bit 1208 may indicate that the data state bit is initiating the process to access the memory cell 1210. In order to access the memory cell 1210, however, the data state bit 1208, the configuration circuit 1212, and the memory circuit 1214 must all be enabled when a FIRE signal is deployed through the integrated circuitry. As used herein, the configuration circuit 1212 can include the configuration register 1102 of FIG. 11 as well as other bit conversion circuit types. As used herein the memory circuit 1214 can include the memory configuration register 1104 of FIG. 11 as well as other bit conversion circuit types.

The configuration circuit 1212 can be configured to have a configuration access state which can be set to one of, and switch between, an enabled state and disabled state. In an example, the configuration circuit 1212 can be configured to enable and disable the configuration access state in response to a configuration state bit 1216. In an example, the configuration state bit 1216 may be stored in a configuration register. The fluid actuation circuit 1202 can transmit selection information 1204 for a fluid actuation device 1206 while within the same data and circuitry, the selection information 1204 includes a data state bit 1208 set to enable the configuration access state. Accordingly, the configuration state bit 1216 may be set or changed so that the configuration circuit 1212 changes from a disabled state to an enabled state. In an example, a data state bit 1208 may be set to a high value or a 1 and this data may be mirrored, matched, or shifted so that an enable state is reflected in the configuration circuit 1212. In an example, this mirroring, matching, or shifting may be undertaken by the configuration state bit 1216 which may mirror the value or signal of the data state bit 1208.

The memory circuit 1214 can be configured to have a memory access state which can be set to one of, and switch between, an enabled state and disabled state. In an example, the memory circuit 1214 is configured to enable or disable the memory access state in response to a memory state bit 1218. In an example, the memory state bit 1218 may be changed in response to the data state bit 1208 and the configuration state bit 1216 both signaling high, each having values of 1, or both indicating they are enabled at the time of a CLK signal rising action or a FIRE signal rising action.

In an example, the memory cell 1210 is made accessible by having both the memory access state of the memory circuit 1214 and the configuration access state of the configuration circuit 1212 enabled. In an example, when data state bit 1208 is enabled as well as the configuration state bit 1216 of the configuration circuit 1212 and the memory state bit 1218 of the memory circuit 1214, then memory cell 1210 may be accessed. In an example, the memory cell may be accessed in response to the memory access state being enabled, the configuration access state being enabled, and the fluid actuation circuit to transmit selection information including the data state bit being set. In an example, the data state bit must be set to a memory access state along with the enabling of the configuration circuit 1212 and the memory circuit 1214. The access being prohibited unless all three of these states are enabled ensures that inadvertent signal noise that may be present on shared circuitry is not accidentally written into memory. As the fluid actuation circuitry 1202 includes selection data 1204 that may be selecting a large number of nozzles over time to indicate printing upon a FIRE signal, this shared circuitry must be secured to ensure that these many signals do not affect the data in a memory cell 1210. Accordingly, the sequence described and the number of state bits that must be enabled to access the memory cell 1210 allows protection of the data of the memory cell as well as ensures memory cell access is granted when intended.

In an example, the memory cell 1210 is accessed for the duration of a FIRE signal. The access of the memory cell 1210 may be to write to the memory cell 1210 or the modification or reading of the memory cell 1210. In an example, the falling edge of a FIRE signal sets the memory access state to a disabled state and the configuration access state to a disabled state. The setting of the disabled state may be accomplished by resetting the configuration state bit 1216 and the memory state bit 1218 to 0 or to a low signal or removing any stored value.

In an example, the memory state bit 1218, configuration state bit 1216, and data state bit 1208 are to be received over the same interface pad. In an example, this can be the DATA pad, the CLK pad, the FIRE pad, or others depending on specific implementations. As used herein, each of these pads corresponds to a line over which electrical signals are provided to the various logical circuits 1200. In an example, a CLK or clock signal in the integrated circuit triggers a memory state bit 1218 to enable the memory access state and a configuration state bit 1216 to enable the configuration access state. As shown in FIG. 10, this can occur on a rising action. In an example, the triggering of a memory state bit 1218 to enable the memory access state and a configuration state bit 1216 to enable the configuration access state can also be on the falling edge of a clock signal.

Figure 13:
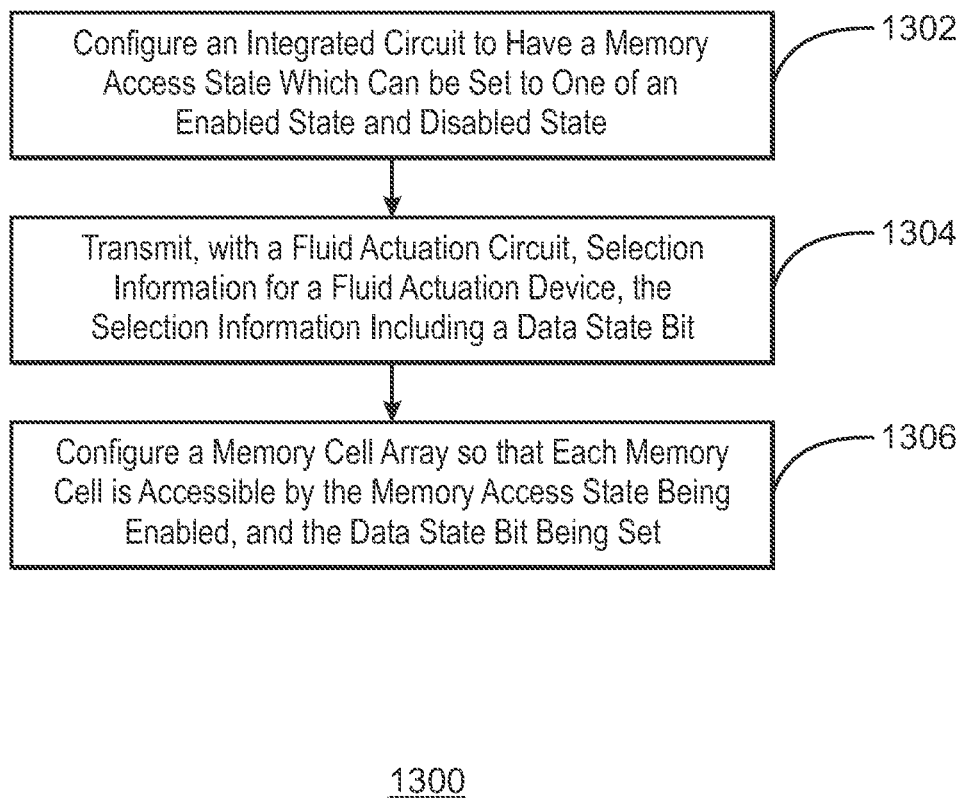
FIG. 13 is a flowchart of an example method for accessing a memory cell in response to enabled access states.

FIG. 13 is a flowchart of an example method 1300 for accessing a memory cell in response to enabled access states. The sequence shown may include or omit actions taken by the integrated circuitry in order to facilitate description of the shown elements.

At block 1302, the method 1300 begins by configuring an integrated circuit to have a memory access state which can be set to one of an enabled state and disabled state. In an example, a configuration circuit enables or disables the configuration access state in response to the configuration state bit.

At block 1304, the method 1300 includes transmitting, with a fluid actuation circuit, selection information for a fluid actuation device, the selection information including a data state bit. In an example, a memory circuit enables or disables the memory access state in response to the memory state bit.

At block 1306, the method 1300 includes configure a memory cell array so that each memory cell is accessible by the memory access state being enabled, and the data state bit being set. In an example, accessing the memory cell includes the configuration access state be enabled in addition to the data state bit and the memory access state both also being enabled. The memory cell may be accessed for the duration of a FIRE signal. In an example, the falling edge of a FIRE signal sets the memory access state to a disabled state and the configuration access state to a disabled state. In an example, the memory state bit, configuration state bit, and data state bit are to be received over the same interface pad. The method 1300 may further include triggering a memory configuration bit to enable the memory access state and a configuration state bit to enable the configuration access state in response to a clock signal.

In an example, in order to access memory, the steps include setting the enable bit using data that is part of the fluid activation devices data stream. Also, in an example, write the configuration register bit. Following these two steps, drive the FIRE signal high to allow an internal enable bit to be set, and the config bit to be cleared. When a configuration bit is set a second time, and the internal enable bit has been set as above, then the memory configuration register can be written to in order to set up the read/write condition as well as which of two types of memory bits can be accessed.

Figure 14:
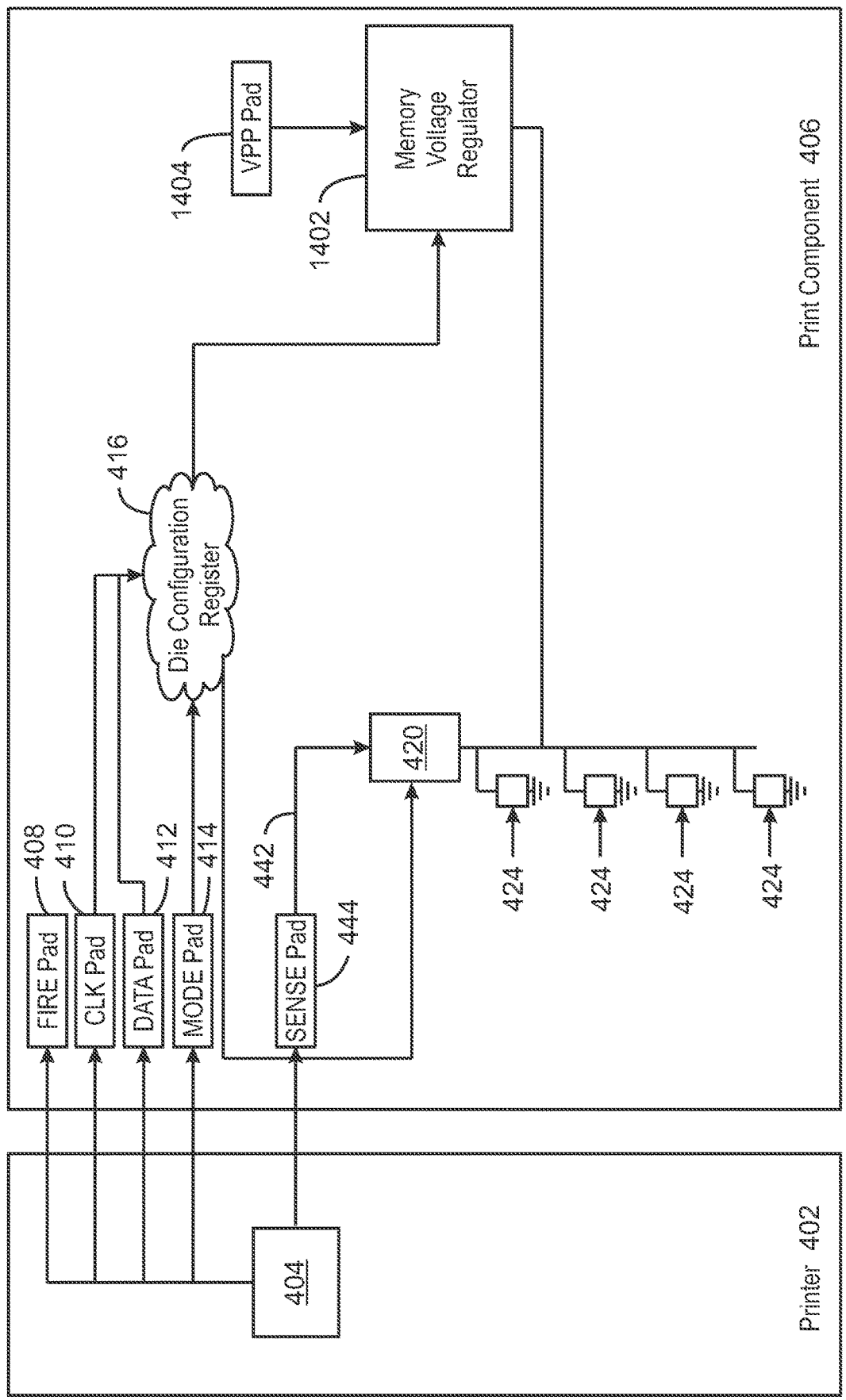
FIG. 14 is a block diagram of an example circuitry and memory bit writing plan.

FIG. 14 is a block diagram of an example circuitry and memory bit writing plan 1400. Like numbered items are as described with respect to FIG. 4.

The memory voltage regulator 1402 can provide voltage to the memory bits 424 in response to a single FIRE signal rising action enabling the memory write mode through the memory and configuration registers. Examples of enabling a write mode can be seen at least with respect to FIG. 9-13. The memory voltage regulator 1402 may accept power from a shared power source (VPP) 1404 that is shared with the fluid actuators. The VPP pad 1404 may refer to a shared power (VPP) bus connected to the fluid actuators. In an example, the fluid actuators are nozzles. The memory voltage regulator may write to the memory bits corresponding to the selected fluid actuators.

The memory bits to be written in parallel may be selected using the high speed datapath, as part of the fire pulse group primitive data. In an example, the memory bits are selected by a primitive number and an address number like fluid actuators. The selection of memory bits by primitive number and address number allows multiple memory bits located within the same die and on the same address to be selected and written in parallel. The selection of memory bits by primitive number and address number also allows multiple memory bits within different silicon die on the same print head to be selected and written in parallel. In one example, the different silicon die can be in within a single pen such as a color pen with three silicon die. The selection and parallel writing of memory bits by primitive number and address number also allows selection of multiple memory bits across multiple silicon die. These silicon bits may also be across multiple print heads within the print system such as parallel writing of memory bits in a color pen and a black pen.

When selecting bits by address, each unique silicon die can select a bit on a different address number, but bits within the same die will be selected on the same address. This reduces pen manufacturing test time by writing multiple bits in parallel within die or across slivers within a print head. Further, the present techniques improves control of programming level by using a FIRE pad signal to control write time.

In an example, the FIRE signal doesn't actually go to the memory voltage regulator 1402. Instead, the memory voltage regulator 1402 is enabled by the memory access mode state the die has entered into using the sequence shown in FIGS. 9-13. Once the memory voltage regulator 1402 is enabled, a rising action in the FIRE signal can enable the memory. Enabling the memory bit allows current to flow from the memory voltage regulator 1402 through the selected combination of memory bits thus program them in parallel.

Figure 15:
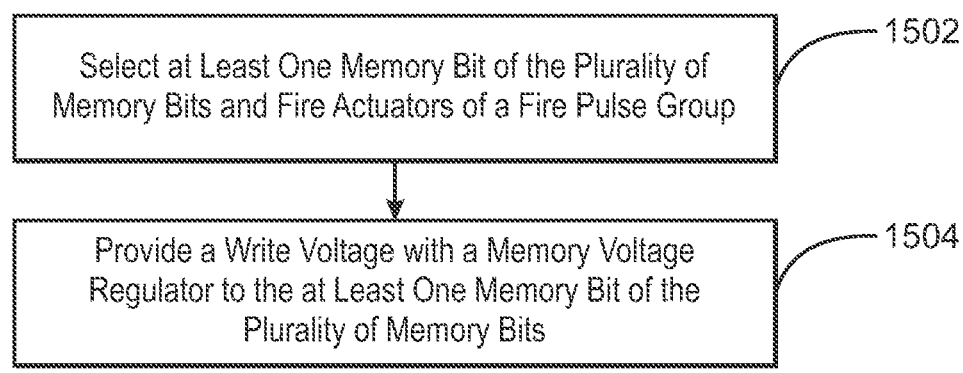
FIG. 15 is a flowchart of an example method for providing a write voltage with a memory voltage regulator to the selected combination of memory bits.

FIG. 15 is a flowchart of an example method 1500 for providing a write voltage with a memory voltage regulator to the selected combination of memory bits. The sequence shown may include or omit actions taken by the integrated circuitry in order to facilitate description of the shown elements.

At block 1502, the method 1500 includes selecting at least one memory bit of the plurality of memory bits and fire actuators of a fire pulse group. In an example, the selecting the combination of memory bits is done with a single fire pulse group. The number of fluid actuation devices may be driven with the same data line for accessing memory. In an example, each of the selected combination of memory bits is written either one at a time or in parallel in response to a single FIRE signal rising action. In an example, a first memory bit of the selected combination of memory bits is located on a first silicon die and a second memory bit of the selected combination of memory bits is located on a second silicon die. In an example, the first silicon die is located in a first print pen and the second silicon die is located in a second print pen. In an example, each of the number of memory bits corresponds to a fluid actuator. In an example, the selected combination of the number of memory bits is identified in data selected by a primitive number and an address number in the single fire pulse group.

At block 1504, the method 1500 includes providing a write voltage with a memory voltage regulator to the at least one memory bit of the plurality of memory bits. In an example, the memory voltage regulator provides the write voltage to the selected combination of the number of memory bits during the duration of a single FIRE signal.

Figure 16:
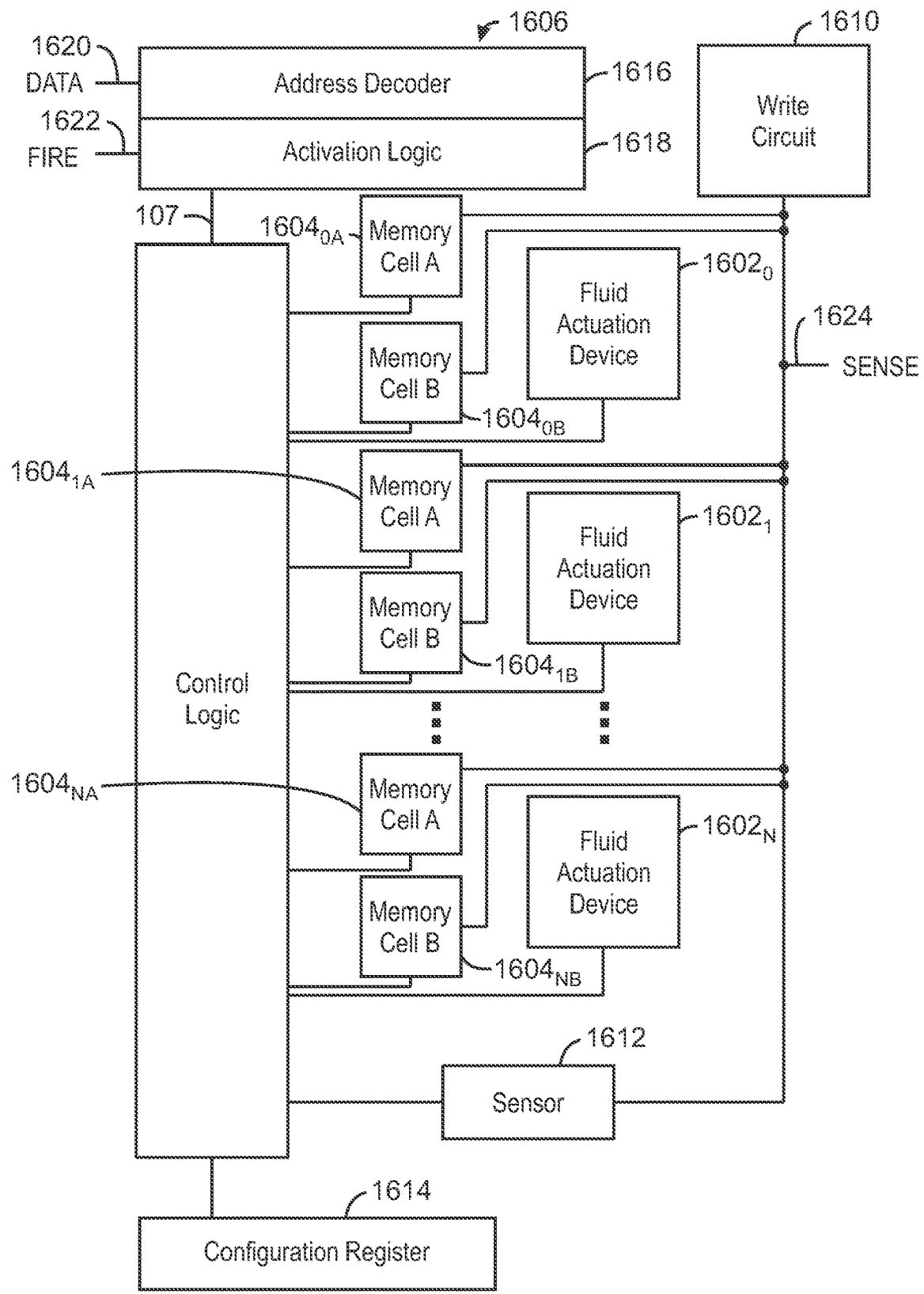
FIG. 16 is a block diagram illustrating another example 1600 of an integrated circuit with multiple memory bits associated with each fluid actuator.

FIG. 16 is a block diagram illustrating another example of an integrated circuit 1600 with multiple memory bits associated with each fluid actuator. The connections between elements can be a signal path, a trace, or other electrically conductive or communicative connection. The integrated circuit 1600 may include a plurality of fluid actuation devices $1602_0$ to $1602_N$, a plurality of memory cells $1604_{OA}$ to $1604_{NB}$, a select circuit 1606, and control logic 1608. In addition, integrated circuit 1602 includes a write circuit 1610, a sensor 1612, and a configuration register 1614.

In this example, select circuit 1606 includes an address decoder 1616 and activation logic 1618. Address decoder 1616 receive addresses and data through a data interface 1620. Address decoder 1616 is electrically coupled to activation logic 1618. Activation logic 1618 receives a fire signal through a fire interface 1622. Each memory cell $1604_{OA}$ to $1604_{NB}$ is electrically coupled to write circuit 1610 through a sense interface 1624. Sensor 1612 is electrically coupled to control logic 1608 through a signal path and to sense interface 1624.

Address Decoder 1616 selects fluid actuation devices $1602_0$ to $1602_N$ and memory cells $1604_{OA}$ to $1604_{NB}$ corresponding to the selected fluid actuation devices $1602_0$ to $1602_N$ in response to an address. As illustrated, each fluid actuation device $1602_N$ has multiple memory cells $1604_{NA}$ and $1604_{NB}$. In an example, the multiple memory cells $1604_{NA}$ and $1604_{NB}$ per fluid actuation device $1602_N$, may be located outside of the configuration register 1614.

The addresses may be received through a data interface 1620. In an example, the activation logic 1618 activates selected fluid actuation devices $1602_0$ to $1602_N$ and memory cells $1604_{OA}$ to $1604_{NB}$ corresponding to the selected fluid actuation devices $1602_0$ to $1602_N$ based on a data signal and a fire signal. The data signal may include nozzle data indicating which fluid actuation device(s) for the provided address are to be selected. The data signal may be received through the data interface 1620. The fire signal indicates when the selected fluid actuation devices are to be activated (i.e., fired) or when the corresponding memory cells are to be accessed. The fire signal may be received through the fire interface 1622. Each of the data interface 1620, fire interface 1622, and sense interface 1624 may be a contact pad, a pin, a bump, a wire, or another suitable electrical interface for transmitting signals to and/or from integrated circuit 1600. Each of the interfaces 1620, 1622, and 1624 may be electrically coupled to a fluid ejection system.

The configuration register 1614 stores data to enable or disable access to the plurality of memory cells $1604_{OA}$ to $1604_{NB}$. The control logic 1608 either activates the selected fluid actuation devices $1602_0$ to $1602_N$ or accesses the memory cells $1604_{OA}$ to $1604_{NB}$ corresponding to the selected fluid actuation devices $1602_0$ to $1602_N$ based on the data stored in the configuration register 1614. In one example, the configuration register 1614 may have multiple bits to correspond to the plurality of memory cells $1604_{OA}$ to $1604_{NB}$. In another example, the configuration register 1614 also stores or transmit data to enable or disable the sensor 1612.

Configuration register 1614 may be a memory device (e.g., non-volatile memory, shift register, etc.) and may include any suitable number of bits (e.g., 4 bits to 24 bits, such as 12 bits) and may include multiple bits per each of the fluid actuation devices $1602_0$ to $1602_N$. In certain examples, configuration register 1614 may also store configuration data for testing integrated circuit 1600, detecting cracks within a substrate of integrated circuit 1600, enabling timers of integrated circuit 1600, setting analog delays of integrated circuit 1600, validating operations of integrated circuit 1600, or for configuring other functions of integrated circuit 1600.

Data stored in memory cells $1604_{0A}$ to $1604_{NB}$ may be read through sense interface 1624 when the selected memory cells $1604_{0A}$ to $1604_{NB}$ have been accessed by control logic 1608. In addition, write circuit 1610 may write data to selected memory cells when the selected memory cells $1604_{0A}$ to $1604_{NB}$ have been accessed by control logic 1608. Sensor 1612 may be a junction device (e.g., thermal diode), a resistive device (e.g., crack detector), or another suitable device for sensing a state of integrated circuit 1600. Sensor 1612 may be read through sense interface 1624.

While the present techniques may be susceptible to various modifications and alternative forms, the techniques discussed above have been shown by way of example. It is to be understood that the technique is not intended to be limited to the particular examples disclosed herein. Indeed, the present techniques include all alternatives, modifications, and equivalents falling within the scope of the following claims.

What is claimed is:

1. An integrated circuit for a print component, the integrated circuit comprising:
   a plurality of memory bits;
   a first contact; and
   a single lane analog bus conductively coupled to the plurality of memory bits;
   wherein the integrated circuit is further configured to read a combination of memory bits of the plurality of memory bits simultaneously through the single lane analog bus when the first contact is high; and
   wherein the pad transmits a single electrical signal from the plurality of memory bits, simultaneously, representing a parallel bit read of the combination of the plurality of memory bits, wherein the single electrical signal indicates the combination of the plurality of memory bits, wherein the first contact is to connect to a fire line for firing nozzles of print component.

2. The integrated circuit of claim 1, wherein the combination of the plurality of memory bits is further selected using a memory access mode enabled by programming a configuration register to address each of the combination of the plurality of memory bits to be selected, wherein the integrated circuit is configured to select the memory bits with the memory access mode enabled by using the same input primitive and address information as for firing the print component over a serial data path.

3. The integrated circuit of claim 2, wherein the memory access mode is enabled by:
   writing a first enable bit in the configuration register for enabling the memory access mode;
   loading a fire pulse group data for selecting a primitive;
   transmitting a firing signal in a sequence to clear the configuration register; and
   writing a second enable bit in the configuration register in response to transmitting the firing signal.

4. The integrated circuit of claim 3, wherein loading the fire pulse group data comprises writing a bit along with setting a non-volatile memory enable bit in a fire pulse group header.

5. The integrated circuit of claim 1, wherein the contact pad is external to connect to a printer-side contact.

6. The integrated circuit of claim 1, wherein the contact pad is an analog signal pad to communicate an analog signal.

7. The integrated circuit of claim 1, wherein the contact pad is a pad to communicate sensor states provided from a sensor, in addition to a memory bits signal transmitted responsive to the parallel bit read of the plurality of memory bits.

8. An integrated circuit associated with a communicating replaceable print head cartridge, the integrated circuit comprising:
   a single analog contact pad to transmit a single electrical signal based on a plurality of memory bits, representing a read of a combination of memory bits of the plurality of memory bits in parallel,
   wherein the single electrical signal indicates the combination of the selected bits of the plurality of memory bits, wherein the integrated circuit is configured to transmit the combination of the plurality of memory bits in parallel through the single analog contact pad when a line connected to a different contact pad is high,
   wherein a single lane analog bus is conductively coupled to the plurality of memory bits in parallel and to the single analog contact pad, wherein the different contact pad is to connect to a fire line for firing nozzles of the cartridge.

9. The integrated circuit of claim 8, wherein the combination of the plurality of memory bits is further selected using a memory access mode enabled by programming a configuration register to address each of the combination of the plurality of memory bits to be selected.

10. The integrated circuit of claim 9, wherein the memory access mode is enabled by:
    writing a first enable bit in the configuration register for enabling the memory access mode;
    loading a fire pulse group data for selecting a primitive;
    transmitting a firing signal in a sequence to clear the configuration register; and
    writing a second enable bit in the configuration register in response to transmitting the firing signal.

11. The integrated circuit of claim 10, wherein loading the fire pulse group data comprises writing a bit along with setting a non-volatile memory enable bit in a fire pulse group header.

12. The integrated circuit of claim 8, wherein a first memory bit of the plurality of memory bits is located on a first silicon die and a second memory bit of the plurality of memory bits is located on a second silicon die.

13. The integrated circuit of claim 12, wherein the first silicon die is associated with a first fluid type and the second silicon die is associated with a second fluid type different from the first fluid type.

14. The integrated circuit of claim 8, comprising select logic to select the memory bits with the memory access mode enabled by using the same input primitive and address information as for firing the print component from the same serial data path.

15. A method of an integrated circuit, comprising:
    receiving a selection of a plurality of memory bits, wherein a single lane analog bus is conductively coupled to the plurality of memory bits in parallel and to a single sense contact pad located on an exterior of a print head, and wherein the combination of the plurality of memory bits is read in parallel through the single lane analog bus when a line connected to a fire pad is high;

receiving an input analog electrical signal provided to the plurality of memory bits; and transmitting, via the single sense contact pad communicatively connected to the plurality of memory bits, a single electrical signal from the plurality of memory bits, simultaneously, representing a parallel bit read of the combination of the plurality of memory bits, wherein the single electrical signal indicates the combination of the plurality of memory bits.

16. The method of claim 15, wherein the selection of the combination of the plurality of memory bits occurs in a memory access mode enabled by programming a configuration register to address each of the combination of the plurality of memory bits to be selected.

\* \* \* \* \*